(12) United States Patent
Tobita

(10) Patent No.: US 7,138,831 B2
(45) Date of Patent: Nov. 21, 2006

(54) LEVEL CONVERSION CIRCUIT AND SERIAL/PARALLEL CONVERSION CIRCUIT WITH LEVEL CONVERSION FUNCTION

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 224 days.

(21) Appl. No.: 10/978,782

(22) Filed: Nov. 2, 2004

(65) Prior Publication Data

US 2005/0206432 A1    Sep. 22, 2005

(30) Foreign Application Priority Data

Mar. 22, 2004    (JP) .............................. 2004-082773

(51) Int. Cl.
*H03K 19/0175* (2006.01)
(52) U.S. Cl. .......................................... 326/81; 326/68
(58) Field of Classification Search ............ 326/80–81, 326/83, 86, 68
See application file for complete search history.

(56) References Cited

U.S. PATENT DOCUMENTS

| | | | | |
|---|---|---|---|---|
| 5,581,506 A | * | 12/1996 | Yamauchi | ............... 365/189.11 |
| 6,590,423 B1 | * | 7/2003 | Wong | ........................... 326/93 |
| 7,006,068 B1 | * | 2/2006 | Haga | ........................... 345/98 |

FOREIGN PATENT DOCUMENTS

| | | |
|---|---|---|
| JP | 2001-320268 A | 11/2001 |
| JP | 2002-251174 A | 9/2002 |
| JP | 2002-358055 A | 12/2002 |
| JP | 2003-115758 A | 4/2003 |

* cited by examiner

*Primary Examiner*—James H. Cho
(74) *Attorney, Agent, or Firm*—Buchanan Ingersoll & Rooney PC

(57) ABSTRACT

A MOS capacitor receiving a clock signal complementary to a sampling clock signal is provided at an input of a clocked inverter that is activated after sampling an input signal to perform level conversion. A charge pump operation of the MOS capacitor is performed in parallel with the activation of the clocked inverter. The power consumption of and the area occupied by a level conversion circuit converting a voltage amplitude of the input signal are reduced without deteriorating a high-speed operating characteristics.

20 Claims, 20 Drawing Sheets

LEVEL CONVERSION CIRCUIT AND SERIAL/PARALLEL CONVERSION CIRCUIT WITH LEVEL CONVERSION FUNCTION

BACKGROUND OF THE INVENTION

1. Field of the Invention

The present invention relates to a level conversion circuit using insulated gate field effect transistors (MOS transistors). In particular, the present invention relates to a level shift circuit having a latch function and used for display devices formed using, for example, liquid-crystal elements or organic electroluminescence (EL) elements. More specifically, the present invention relates to a circuit configuration for latching and level-shifting a pixel data signal applied to a display pixel.

2. Description of the Background Art

In a display device using liquid-crystal elements or organic EL (electroluminescence) elements as display pixel elements, a level conversion circuit is employed for enlarging a signal amplitude. For example, in order to accurately drive the display pixel elements in accordance with a display signal, for achieving gradational display, the amplitude of an image data signal is enlarged to generate the display signal and supply the display signal to the pixel element.

For such a display device, it is generally required to reduce power consumption for preventing heat generation, and to reduce the power consumption in an application such as mobile equipment having a battery as a power source. Prior art document 1 (Japanese Patent Laying-Open No. 2003-115758) discloses a configuration of a level conversion circuit aiming to reduce power consumption.

In the configuration disclosed in the prior art document 1, an input signal is held in a first capacitance element in accordance with a sampling pulse. After this sampling is completed, a MOS drive stage having level conversion function is driven in accordance with the voltage held in the first capacitance element. In accordance with an output signal of the MOS drive stage, a second capacitance element is charged to generate a level-converted signal. With the configuration disclosed in the prior art document 1, it is intended to perform level conversion on the input signal with a smaller number of elements, in addition to reduction in power consumption.

Prior art document 2 (Japanese Patent Laying-Open No. 2002-358055) also discloses a level conversion circuit with an intention to reduce power consumption. In the level conversion circuit disclosed in the prior art document 2, a current-mirror type input buffer circuit for comparing an input signal with a reference voltage is activated for an activation period of a vertical scan start instruction signal, and an output signal of the current-mirror type input buffer circuit is latched by a latch circuit having level conversion function when the vertical scan start instruction signal is inactivated. The current-mirror type input buffer circuit is operated for a minimum necessary period of time, thereafter the output signal thereof is latched by the latch circuit and level conversion is performed by this latch circuit so as to reduce power consumption.

Moreover, prior art document 3 (Japanese Patent Laying-Open No. 2001-320268) discloses a level conversion circuit with the purpose of achieving a high-speed operation in addition to reduction of power consumption. In a configuration disclosed in the prior art document 3, an amplitude-limited control signal is generated in accordance with an input clock signal, and an output drive stage is driven in accordance with the amplitude-limited control signal. In limiting the amplitude, threshold voltage drop of a MOS transistor (insulated gate field effect transistor) is utilized, the output drive stage is constituted of a CMOS inverter, and one of the drive transistors is set to a strongly-on state while the other is set to a weakly-on state. The degree of the on state of the output drive transistors is simply controlled to achieve high-speed operation. Further, a transition period of the potential level on an output node is shortened to reduce the period in which a through current flows and thereby to reduce power consumption.

In addition, the prior art document 4 (Japanese Patent Laying-Open No. 2002-251174) discloses a configuration with the purpose of reducing power consumption of a level conversion circuit for enlarging a signal amplitude in an image display device. In the configuration disclosed in the prior art document 4, an output transistor has a gate clamped by diode-connected a MOS transistor, and further supplied with an input signal via a capacitance element. The gate potential of this output drive transistor is varied through capacitive coupling by the capacitance element and the output drive transistor is driven to an on/off state at a high speed, so that the through current is reduced and power consumption is reduced.

In a display device such as liquid-crystal display device, a thin-film transistor (TFT) is used as a MOS transistor. In this case, in order to prevent deterioration in characteristics of display pixel elements, a low-temperature polysilicon TFT is employed. Such a low-temperature polysilicon TFT is merely subject to annealing or heat treatment at a low temperature. Thus, as compared with a MOS transistor using single-crystal silicon, the crystal quality of the low-temperature polysilicon TFT is inferior. Therefore, in such TFTs, threshold voltage varies to a greater degree for different transistors and the channel resistance (ON resistance) in a conductive state is large.

In the configuration disclosed in the prior art document 1, in a level-converting operation, the output drive transistor is driven, in accordance with the input signal of small amplitude that is held in the first capacitance element, to discharge the voltage held in the second capacitance element. Therefore, the current drivability of the output drive transistor is small, and a level-converted signal of a large amplitude that is held in the second capacitance element cannot be discharged at a high speed, resulting in a problem that a high-speed operation is not ensured.

In the configuration disclosed in the prior art document 2, the current-mirror type buffer circuit is used for identifying the voltage level of the input signal. The input signal is compared with the reference voltage to generate the internal signal according to the result of this comparison, and the internal signal is latched by the latch circuit. Accordingly, the input buffer circuit has a large number of transistor elements, resulting in a problem that the occupied area cannot be reduced. In addition, if the transistor elements have greatly-varied threshold voltages, offset in a comparison stage of the current-mirror type input buffer circuit cannot be compensated for, resulting in a problem that an accurate input signal cannot be generated.

In the configuration disclosed in the prior art document 3, the gate potential of the transistor of the output drive stage for performing level conversion is level-shifted by the diode-connected MOS transistor. The degree of the ON state of the output drive transistors is changed in accordance with the input signal. Accordingly, in the output drive stage, both of charging and discharging drive transistors are in an ON state, resulting in a problem that a through current flows all the time.

In the configuration disclosed in the prior art document 4, the gate potential of the level-converting output drive transistor is clamped by the diode-connected MOS transistor. Through the capacitive coupling of the input signal, the gate potential of the drive transistors is changed. Accordingly, it is required to provide capacitance elements respectively for the high-side drive transistor and the low-side transistor on the node receiving the input signal, resulting in a problem that the load of the input signal increases. Further, the prior art document 4 disclosed a further configuration for driving an internal output node through capacitive coupling of an input signal. Specifically, between the gate of a first drive transistor and the internal output node, a capacitance element receiving the input signal is connected. The internal output node is further coupled to the input signal via a second drive transistor in accordance with an inverted signal of the input signal. Thus, if a skew occurs between the complementary input signals, the signal on the internal output node is coupled via the second drive transistor to the input signal, resulting in a problem that the internal output node cannot sufficiently charged and thus an accurately level-converted signal cannot be generated.

SUMMARY OF THE INVENTION

An object of the present invention is to provide a level conversion circuit capable of converting a signal of small voltage amplitude into a signal of large voltage amplitude at a high speed and with low power consumption as well as a serial/parallel level conversion circuit using the level conversion circuit.

A level conversion circuit according to a first aspect of the present invention includes: a first insulated gate field effect transistor of a first conductivity type for transferring an input signal applied to an input node to a first internal node according to a first clock signal from a first clock input node; a MOS capacitance element formed of an insulated gate field effect transistor and connected between a second clock input node receiving a second clock signal and the first internal node for selectively forming a capacitance according to a potential difference between the first internal node and the second clock input node; and a clocked inverter activated, when the first insulated gate field effect transistor is non-conductive, according to one of the first clock signal and a clock signal corresponding to the first clock signal and the second clock signal, for inverting a potential on the first internal node to generate, on a second internal node, a signal having an amplitude larger than an amplitude of the input signal.

A level conversion circuit according to a second aspect of the present invention includes: a first insulated gate field effect transistor of a first conductivity type for transferring an input signal to a first internal node according to a first clock signal from a first clock input node; a second insulated gate field effect transistor of the first conductivity type for transmitting a second clock signal applied to a second clock input node to a second internal node according to a voltage on the first internal node; a low drive circuit for driving the second internal node to a voltage level of a low-side power supply node according to a clock signal in phase with the first clock signal on the first clock input node; and a clocked inverter for driving a third internal node according to a signal potential on the second internal node when activated in accordance with clock signals in phase with the clock signals on the first clock input node and the second clock input node.

A level conversion circuit according to a third aspect of the present invention includes: a clocked inverter enabled in response to a first clock signal, and inverting and transferring, when enabled, a signal on a first node onto a second node; a first insulated gate field effect transistor made conductive when said clocked inverter is inactive, and transferring, when made conductive, an input signal onto the first node; and a MOS capacitance element formed of an insulated gate field effect transistor and connected between said first node and a third node, for selectively performing a charge pump operation in response to the first clock signal when said clocked inverter is enabled.

A level conversion circuit according to a fourth aspect of the present invention includes: a first insulated gate field effect transistor made conductive in response to a first clock signal and transferring, when made conductive, an input signal onto a first node; a second insulated gate field effect transistor selectively made conductive according to a signal on said first node and transferring, when made conductive, a second clock signal onto a second node; a third insulated gate field effect transistor selectively made conductive according to a third clock signal complementary to said second clock signal and transferring, when made conductive, the second clock signal onto said second node; and a clocked inverter made active in response to the second and third clock signals when said third insulated gate field effect transistor is non-conductive and inverting and transferring the signal on the second node onto a subsequent node.

A serial/parallel conversion circuit with level conversion function according to a fifth aspect of the present invention includes first and second level conversion circuits operating complementarily to each other and a transfer circuit for taking in the output signals of the first and second level conversion circuits to output the taken-in output signals in parallel. The first level conversion circuit includes: a first insulated gate field effect transistor of a first conductivity type for transferring an input signal applied to an input node to a first internal node according to a clock signal from a first clock input node receiving the clock signal corresponding to a first clock signal; a MOS capacitance element connected between a second clock input node receiving a second clock signal and the first internal node for selectively forming a capacitance according to a potential difference between the first internal node and the second clock input node; and a clocked inverter selectively activated, when the first insulated gate field effect transistor is in a non-conductive state, according to the first clock signal and the second clock signal, for inverting a potential on the first internal node to generate, on a second internal node, a signal having an amplitude larger than an amplitude of the input signal.

The second level conversion circuit operates complementarily to the first level conversion circuit according to the first and second clock signals, has the same configuration as the first level conversion circuit, and operates in parallel with the first level conversion circuit to level-convert the input signal. The transfer circuit performs the taking-in and transfer operations according to the clock signal corresponding to the first clock signal and the second clock signals. The first clock signal and the second clock signal each have a cycle twice as long as a cycle at which the input signal is applied.

A serial/parallel conversion circuit with level conversion function according to a sixth aspect of the present invention includes a first and second level conversion circuits operating complementarily to each other and having the same configuration and a transfer circuit taking in respective output signals of the first and second level conversion circuits to output the taken-in signals in parallel. The first level conversion circuit includes: a first insulated gate field effect transistor of a first conductivity type for transferring an input signal to a first internal node according to a first clock signal from a first clock input node; a second insulated gate field effect transistor of the first conductivity type for transmitting a second clock signal applied to a second clock input node to a second internal node according to a voltage on the first internal node; a low drive circuit driving the second internal node to a voltage level on a low-side power supply node according to a clock signal in phase with the clock signal on the first clock input node; and a clocked inverter selectively activated according to clock signals corresponding to the clock signals on the first clock input node and the second clock input node for driving a third internal node according to the signal on the second internal node. To the third internal node, the level-converted signal is output. The first and second level conversion circuits operate in parallel to level-convert the input signal. The transfer circuit performs the take-in and transfer operation according to the first and second clock signals. The first clock signal and the second clock signal each have a cycle twice as long as a cycle at which the input signal is applied.

A serial/parallel conversion circuit with level conversion function according to a seventh aspect of the present invention includes a plurality of level conversion circuits provided in parallel and having a common configuration. The level conversion circuits each include: a first insulated gate field effect transistor of a first conductivity type for transferring an input signal applied to an input node to an internal node according to a first logic level of a clock signal from a first clock input node; a MOS capacitance element connected between the internal node and a second clock input node receiving a clock signal complementary to the clock signal on the first clock input node for selectively forming a capacitance according to a potential difference between the internal node and the second clock input node; and a clocked inverter selectively activated when the first insulated gate field effect transistor is in a non-conductive state, according to the clock signal on the first clock input node and a clock signal complementary to the clock signal on the first clock input node, for inverting a potential on the internal node to generate, on a second internal node, a signal having an amplitude larger than an amplitude of the input signal.

The serial/parallel conversion circuit with level conversion function according to the seventh aspect of the present invention further includes a plurality of output latch circuits, provided corresponding to the respective level conversion circuits, each for latching an output signal of a corresponding level conversion circuit according to a common latch instruction signal; and a clock supply circuit supplying clock signals to respective first clock input nodes of the level conversion circuits, such that the first logic level period of the clock signal at the first clock input node is different from others.

A serial/parallel conversion circuit with level conversion function according to an eighth aspect of the present invention includes a plurality of level conversion circuits provided commonly to an input signal and having a common configuration. The level conversion circuits each include: a first insulated gate field effect transistor of a first conductivity type for transferring the input signal to a first internal node according to a first logic level of a first clock signal from a first clock input node; a second insulated gate field effect transistor of the first conductivity type for transmitting to a second internal node a second clock signal applied to a second clock input node according to a voltage on the first internal node; a low drive circuit for driving the second internal node to a voltage level of a low-side power supply node according to a clock signal in phase with the first clock signal on the first clock input node; and a clocked inverter enabled according to clock signals corresponding to the clock signals on the first and the second clock input nodes, for driving a third internal node according to a signal on the second internal node.

The serial/parallel conversion circuit with level conversion function according to the eighth aspect of the present invention further includes: a plurality of output latch circuits, provided corresponding to the respective level conversion circuits, each for latching an output signal of a corresponding level conversion circuit according to a common latch instruction signal; and a clock supply circuit supplying the clock signals to the respective first clock input nodes of the level conversion circuits such that the first clock signals at the first and second clock nodes of the respective level conversion circuits are different in first logic level period of each clock signal from each other.

A serial/parallel conversion circuit with level conversion function according to a ninth aspect of the present invention includes a plurality of level conversion circuits having the same configuration and coupled commonly to an input node. The level conversion circuits each include: a first insulated gate field effect transistor of a first conductivity type for transferring an input signal applied to the input node to a first internal node according to a first clock signal from a first clock input node; a MOS capacitance element connected between a second clock input node and the first internal node for selectively forming a capacitance according to a potential difference between the first internal node and the second clock input node; and a clocked inverter selectively activated when the first insulated gate field effect transistor is in a non-conductive state, according to the second clock signal from the second clock input node and a clock signal complementary to the second clock signal on the second clock input node, for inverting a potential on the first internal node to generate, on a second internal node, a signal that has an amplitude larger than an amplitude of the input signal.

The serial/parallel conversion circuit with level conversion function according to the eighth aspect of the present invention further includes: a plurality of latch circuits provided, corresponding to the respective level conversion circuits, each for latching an output signal of a corresponding level conversion circuit according to a common latch instruction signal; and a clock supply circuit for supplying clock signals to the respective second clock input nodes of the level conversion circuits such that the respective clocked inverters are activated in different periods of time from each other. The clock signal applied to the second clock input node of each respective level conversion circuit at a preceding stage in a clock supply sequence is inverted and supplied to the first clock input node of a respective level conversion circuit at a subsequent stage in the clock supply sequence.

A serial/parallel conversion circuit with level conversion function according to a tenth aspect of the present invention includes a plurality of level conversoin circuits provided commonly to an input signal and having a common configuration. The level conversion circuits each include: a first insulated gate field effect transistor of a first conductivity type for transferring the input signal to a first internal node according to a clock signal from a first clock input node; a second insulated gate field effect transistor of the first conductivity type for transmitting a second clock signal applied to a second clock input node to a second internal node according to a voltage on the first internal node; a low-side drive circuit for driving the second internal node to a voltage level of a low-side power supply node according to a third clock signal opposite in phase to the second clock signal on the second clock input node; and a clocked inverter selectively activated according to the second and third clock signals for driving, when activated, a third internal node according to a signal on the second internal node.

The serial/parallel conversion circuit with level conversion function according to the tenth aspect of the present invention further includes: a plurality of output latch circuits, provided corresponding to the respective level conversion circuits, each for latching an output signal of a corresponding level conversion circuit according to a latch instruction signal; and a clock supply circuit supplying clock signals to respective second clock input nodes of the level conversion circuits such that each activation period of the clocked inverter is different from others. The clock signal applied to the second clock input node of the level conversion circuit at each respective preceding stage in a clock supply sequence is inverted and supplied to the first clock input node of the level conversion circuit at a respective subsequent stage.

According to the first aspect of the invention, the input signal is held in the MOS capacitance element. Accordingly, when the input signal is sampled, the MOS capacitance element stops the operation as the capacitance element, to cause the voltage held in the MOS capacitance element to change according to the input signal at a high speed. A high-speed level conversion is thus achieved. Further, according to the charged voltage of the MOS capacitance element, the clocked inverter is driven. Then, the clocked inverter can be driven for only a required period of time to reduce current consumption. Moreover, by applying the clock signal on the second clock input node to the MOS capacitance element, the voltage held therein can be boosted through a charge pump operation. It is thus ensured to drive a clocked inverter at a subsequent stage. The period of time in which through current flows in the clocked inverter can be shortened and accordingly current consumption can be reduced.

According to the second aspect of the invention, the input signal is sampled, the second clock signal is transferred to the clocked inverter at the subsequent stage according to the sampled voltage, and the clocked inverter at the subsequent stage drives the internal node according to the transferred signal. With the second clock signal, the second MOS transistor can be operated as a MOS capacitance element so that the gate potential thereof is increased to rapidly change the potential on the internal output node.

According to the third aspect of the invention, similarly to the first aspect of the invention, the input signal is held at the MOS capacitor and the input signal is boosted through charge pump operation of the MOS capacitor. Thus, the input signal can be sampled and level-converted at high speed. In addition, control of conduction/non-conduction of the first insulated gate field effect transistor and the control of charge pump operation by MOS capacitor can be made by separate clock signals, the timing for sampling the input signal can be optimized and thus, level-conversion can be performed accurately with reduced current consumption.

According to the fourth aspect of the invention, the input signal is sampled according to complementary clock signals and the clock signal is transferred to an input of the clocked inverter in accordance with the taken-in input signal. The clocked inverter is activated in parallel with the clock signal transfer and thus, the input signal can be converted into a signal having an amplitude the same as the clock signal. The input signal merely drives the gate of the insulated gate field effect transistor and the load thereof is very small. As a result, the input signal can be taken in and level-converted at high speed.

According to the fifth aspect of the invention, the level conversion circuit of the first aspect is employed and thus the input signal can be frequency-divided and level-converted at high speed.

According to the sixth aspect of the invention, the level conversion circuits of the third aspect are used in parallel and operate complementarily to each other. Thus, the input signal can be frequency-divided and level-converted at high speed.

According to the seventh aspect of the invention, a plurality of level conversion circuits of the first aspect are provided. Respective sampling periods of the level conversoin circuits are made different so that signals applied serially to the input node can be level-converted and converted into parallel signals at high speed.

According to the seventh aspect of the invention, a plurality of level conversion circuits of the fourth aspect are employed. Respective input signals are sampled at the timings different from each other. The input signals applied serially can thus be level-converted to generate parallel signals at high speed.

According to the ninth aspect of the invention, a plurality of level conversion circuits of the first aspect are employed. Further, after the sampling by the level conversion circuit at the preceding stage is completed, the sampling operation by the level conversoin circuit at the subsequent stage is activated. Then, accurate and fast level conversion is achieved and signals applied serially can be converted into parallel signals and output as parallel signals.

According to the tenth aspect of the invention, a plurality of level conversion circuits of the second aspect are provided and the level conversoin circuits perform the sampling operations at different timings from each other in accordance with the sampling clock signals. Further, after the sampling operation by the level conversion circuit at the preceding stage is completed, the sampling operation by the level conversion circuit at the subsequent stage is carried out. Thus, input signals applied serially can accurately be level-converted to generate parallel signals. Moreover, only a selected level conversoin circuit is coupled to the input signal so that the load of the input signal is reduced and accordingly current consumption can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
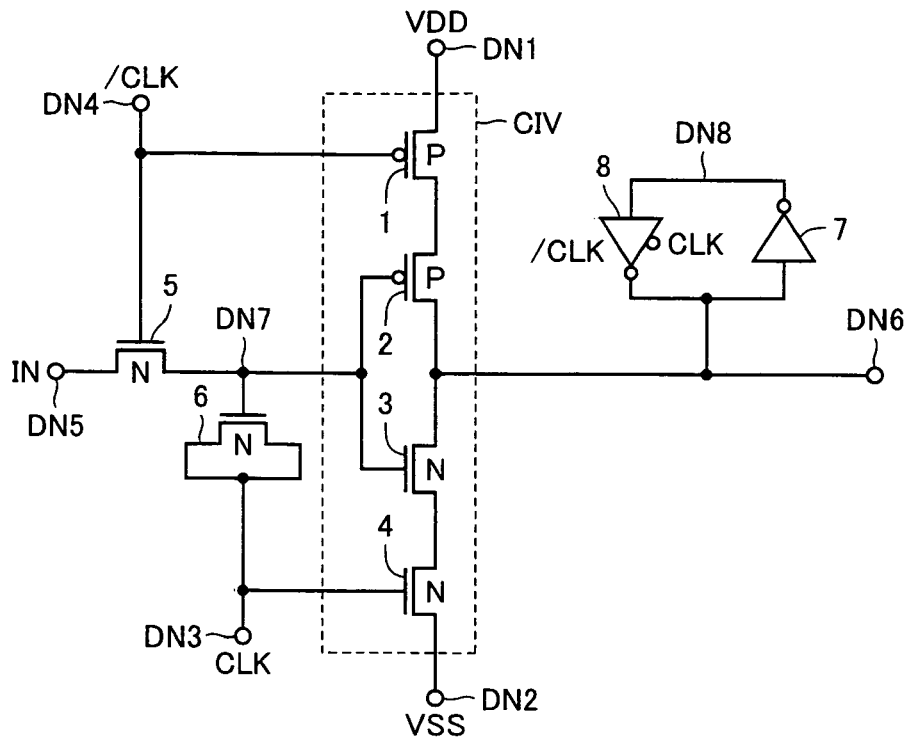
FIG. 1 shows a configuration of a level conversion circuit according to a first embodiment of the present invention.

FIG. 1 shows a configuration of a level conversion circuit according to a first embodiment of the present invention. Referring to FIG. 1, the level conversion circuit includes an N-channel MOS transistor (insulated gate field effect transistor) 5 transmitting an input signal IN applied to an input node DN5 to an internal node DN7 according to a clock signal /CLK applied to an input node DN4, a MOS-type capacitance element (hereinafter referred to as MOS capacitor) 6 coupled to internal node DN7 and selectively forming a capacitor according to a clock signal CLK from a clock input node DN3, a clocked inverter CIV selectively activated according to clock signals CLK and /CLK and driving, when activated, an internal output node DN6 according to the signal on internal node DN7, and an inverter 7 and a clocked inverter 8 that constitute a latch circuit latching a signal voltage on internal output node DN6.

When this level conversion circuit is used in a display device (display panel), input signal IN is a signal applied from an external LSI (Large Scale Integrated circuit chip) such as driver IC and is a signal changing between 0 V and 3 V, for example. Clock signals CLK and /CLK are generated in the display device and change between a reference voltage VSS and a power supply voltage VDD. This voltage VDD has a voltage level higher than an H level (logic high level) VIH of input signal IN, and is used as a power supply voltage of the display device, and is 5 V, for example. Voltage VSS is a reference voltage of voltage measurement basis that is a ground voltage, for example.

Clocked inverter CIV includes P-channel MOS transistors 1 and 2 connected in series between a high-side power supply node DN1 and internal output node DN6 as well as N-channel MOS transistors 3 and 4 connected in series between internal output node DN6 and a low-side power supply node DN2. To the gate of P-channel MOS transistor 1, clock signal /CLK is applied. The gates of MOS transistors 2 and 3 are commonly connected to internal node DN7. To the gate of N-channel MOS transistor 4, clock signal CLK is applied.

MOS capacitor 6 is constituted of an N-channel MOS transistor having its gate connected to internal node DN7 and its source and drain nodes connected to clock input node DN3. When the voltage level of the gate of MOS capacitor 6 is higher than the voltage level of the source and drain nodes of MOS capacitor 6 by at least its threshold voltage, a channel is generated between the source and the drain so that MOS capacitor 6 serves as a capacitance element. When the difference between the gate voltage and the source/drain voltage of MOS capacitor 6 is not greater than its threshold voltage, no channel is generated. In this case, a capacitor formed by the overlapping region between the source and drain, and gate electrode merely serves as a capacitor to internal node DN7.

Inverter 7 inverts a voltage on internal output node DN6 to transmit the inverted voltage to an internal node DN8. Clocked inverter 8 inverts the signal on internal node DN8 to transmit the inverted signal to internal output node DN6. Like clocked inverter CIV, these inverter 7 and clocked inverter 8 are supplied with the voltages VDD and VSS as operating power supply voltages.

Figure 2A:
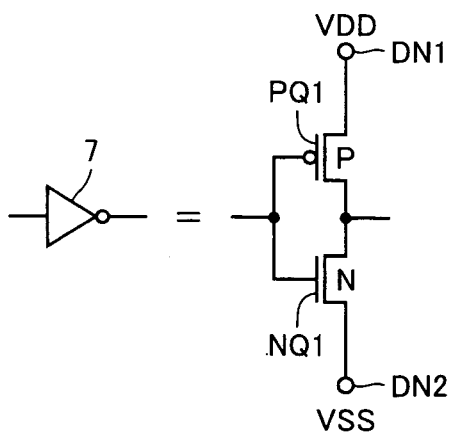
FIG. 2A shows a configuration of an inverter shown in FIG. 1

FIG. 2A specifically shows a configuration of inverter 7 shown in FIG. 1. Referring to FIG. 2A, inverter 7 is comprised of a P-channel MOS transistor PQ1 and an N-channel MOS transistor NQ1 connected between high-side power supply node DN1 and low-side power supply node DN2. In other words, inverter 7 is constituted of a CMOS inverter receiving voltages VDD and VSS as its operating power supply voltages.

Figure 2B:
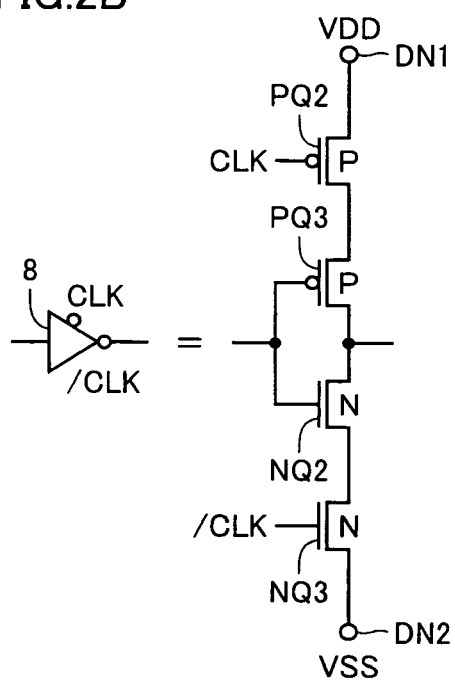
FIG. 2B shows a configuration of a clocked inverter shown in FIG. 1.

FIG. 2B specifically shows a configuration of clocked inverter 8 shown in FIG. 1. Referring to FIG. 2B, clocked inverter 8 includes P-channel MOS transistors PQ2 and PQ3 connected in series between high-side power supply node DN1 and the output node as well as N-channel MOS transistors NQ2 and NQ3 connected in series between the output node and low-side power supply node DN2. To respective gates of MOS transistors PQ2 and NQ3, clock signals CLK and /CLK are applied. The gates of MOS transistors PQ3 and NQ2 are connected together to internal output node DN8 shown in FIG. 1.

As shown in FIG. 2B, clocked inverter 8 operates complementarily to clocked inverter CIV. When clocked inverter CIV is in an output high impedance state, the inverter latch comprised of inverter 7 and clocked inverter 8 operates to latch the signal on internal output node DN6. On the contrary, when clocked inverter CIV is activated, clocked inverter 8 is in an output high impedance state, so that internal output node DN6 is released from the latched state and is driven by clocked inverter CIV.

Figure 3:
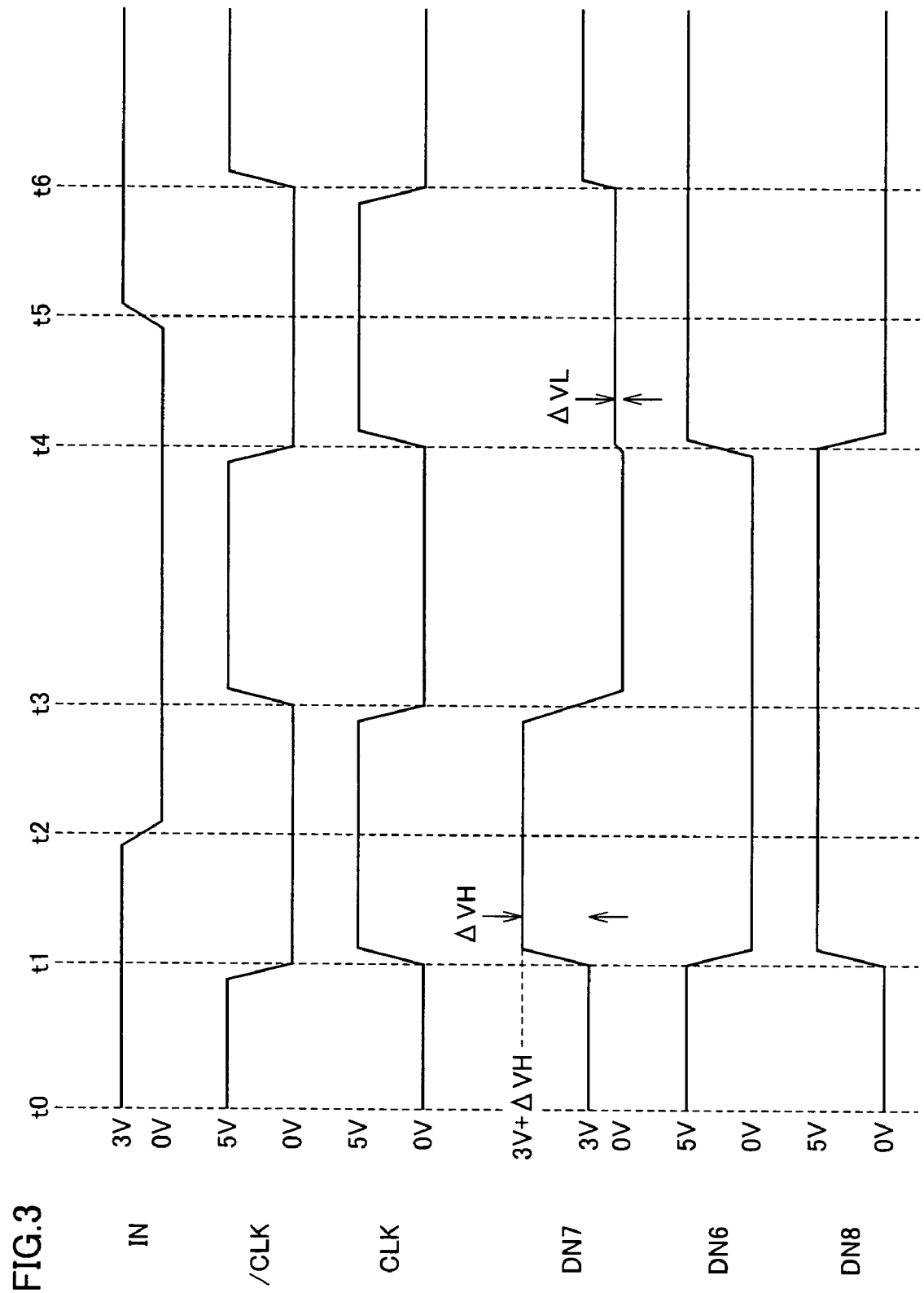
FIG. 3 is a timing diagram representing an operation of the level conversion circuit shown in FIG. 1.

FIG. 3 is a signal waveform diagram representing an operation of the level conversion circuit shown in FIG. 1. FIG. 3 shows an exemplary operation in which an input signal changes between 3 V and 0 V and this signal with the voltage amplitude of 3 V is converted into a signal changing between 5 V and 0 V. Specifically, H level of 3 V of input signal IN is converted into H level of 5 V to be output to internal output node DN6. As for L level, no level conversion is performed since L level of input signal IN and that of the internal signal (signal on output node DN6) are both 0 V.

It is assumed here that N-channel MOS transistors 3 to 5 and the N-channel MOS transistor constituting MOS capacitor 6 each have a threshold voltage of 2 V and P-channel MOS transistors 1 and 2 each have a threshold voltage of -2V. The threshold voltage conditions also hold for the components of inverter 7 and clocked inverter 8.

At time t0, input signal IN is at H level (logic high level), clock signal /CLK is at H level and clock signal CLK is at L level (logic low level). In this state, MOS transistor 5 is turned on so that H level of input signal IN is transmitted to internal node DN7. At this time, clock signal CLK is at L level. Therefore, the voltage difference between internal node DN7 and clock input node DN3 is 3 V. The voltage difference between internal node DN7 and clock input node DN3 is greater than the threshold voltage (2 V) of the MOS transistor constituting MOS capacitor 6, so that a channel is formed in MOS capacitor 6. Accordingly, a capacitance is formed that corresponds to the gate area of the MOS transistor constituting MOS capacitor 6, and H level of input signal IN is held in the capacitance of MOS capacitor 6.

Clocked inverter CIV has MOS transistors 1 and 4 kept in a turned-off state or inactive state, and thus is in an output high impedance state. Clocked inverter 8 is in an active state to operate as an inverter and thereby holds the state of internal output node DN6 in the preceding cycle. In FIG. 3, a signal of H level is transmitted in the preceding cycle to be held on internal output node DN6. Since internal output node DN6 is at H level, internal node DN8 is at a ground voltage level or L level.

At time t1, after clock signal /CLK falls to L level, clock signal CLK rises to H level. This change in voltage (5 V) of clock signal CLK is transmitted through charge pump operation of MOS capacitor 6 to internal node DN7 so that the voltage on internal node DN7 increases by ΔVH. This amount of voltage change ΔVH is represented by the following equation:

$$\Delta VH=(VCH-VCL)\cdot C6H/(C6H+CST) \quad (1),$$

where VCH and VCL respectively represent H level (5 V) and L level (0 V) of clock signals CLK and /CLK, C6H represents a capacitance value of capacitor 6, and CST represents a capacitance value of a parasitic capacitance (not shown) on internal node DN7. Thus, (VCH-VCL) represents the voltage amplitude of clock signals CLK and /CLK and equation (1) represents that the electric charges injected by MOS capacitor 6 to internal node DN7 is distributed to MOS capacitor 6 and to the parasitic capacitance (not shown).

For example, it is assumed that C6H is equal to CST (C6H=CST) in equation (1). Then, equation (1) is represented as:

$$\Delta VH=(VCH-VCL)\cdot(1/2) \quad (2).$$

Under this condition, the amount of voltage change ΔVH is 0.5 times as large as the voltage amplitude of clock signal CLK (ΔVH=2.5 V). In this case, the voltage level of internal node DN7 is 5.5 V. This voltage level is a voltage level that can cause P-channel MOS transistor 2 and N-channel MOS transistor 3 in clocked inverter CIV to be turned off and on, respectively, as in the internal circuit operating on power supply voltage VDD. Thus, clocked inverter CIV can be fully activated to accurately generate a binary signal with an amplitude of 5 V.

According to the voltage level of internal node DN7, the voltage level of internal output node DN6 falls to L level and inverter 7 drives to and holds at H level the internal node DN8. At this time, clocked inverter 8 is in an inactive state and internal node DN6 can be driven at a high speed according to the voltage level of internal node DN7.

At time t2, input signal IN changes from H level to L level. At this time t2, clock signals CLK and /CLK are at H level and L level, respectively, and clocked inverters CIV and 8 are in an active (enable) state and an inactive (disable) state, respectively. The time duration from time t2 to time t3 at which clock signal /CLK transitions to H level subsequently is a setup time for taking input signal IN into the level conversion circuit. In this setup period, MOS transistor 5 is in a turned-off state.

At time t3, clock signal CLK falls to L level so that the voltage level of internal node DN7 is also caused to fall by a charge pump operation of the capacitance of MOS capacitor 6 and the voltage level of internal node DN7 falls to 3 V or H level of input signal IN.

After clock signal CLK falls to L level, clock signal /CLK rises to H level. Then, MOS transistor 5 is turned on, input signal IN is transmitted to internal node DN7, and the voltage level of internal node DN7 changes to the voltage level (0 V) equal to L level of input signal IN. At this time, clock signal CLK is at L level, the voltage level of clock input node DN3 is the ground voltage level and the voltage levels of internal node DN7 and clock input node DN3 are equal to each other. Thus, no channel is formed in MOS capacitor 6. In this state, the capacitance between internal node DN7 and clock input node DN3 is only the significantly small capacitance formed at the overlapping region of the gate and the drain and source regions of the transistor constituting MOS capacitor 6.

According to the rise and fall of clock signals CLK and /CLK respectively, clocked inverter CIV enters inactive state and thus enters output high impedance state. Clocked inverter 8 is activated to invert the signal of H level on internal node DN8 and transmit the inverted signal to output node DN6. Then, internal output node DN6 is maintained at L level by the latch circuit comprised of inverter 7 and clocked inverter 8.

At time t4, after clock signal /CLK falls to L level, clock signal CLK rises to H level. At this time, no MOS capacitance is generated in MOS capacitor 6, and there is only a minute capacitance present in MOS capacitor 6 between the gate and the source and drain of the MOS transistor constituting MOS capacitor 6. Even if internal node DN7 is in an electrically floating state and clock signal CLK is at H level, only this minute capacitance serves to perform a charge pump operation so that voltage level of internal node DN7 changes by ΔVL. This amount of voltage change ΔVL is sufficiently smaller than the threshold voltage 2V of MOS transistor 3, so that MOS transistor 3 is kept in turned-off state. Clocked inverter CIV determines the internal node DN7 being substantially at L level.

According to fall of clock signal /CLK and rise of clock signal CLK, clocked inverter CIV is activated. Internal output node DN6 is driven according to the voltage level of internal node DN7 to have the voltage level thereof changed to H level. Internal node DN8 is driven by inverter 7 to L level. At this time, clocked inverter 8 is in an inactive state and internal output node DN6 is driven at a high speed by clocked inverter CIV.

At time t5, the level of input signal IN changes from L level to H level. In this state, clock signal /CLK is at L level, MOS transistor 5 is in a turned-off state, and internal node DN7 is kept at L level (voltage ΔVL level). The time duration from time t5 to time t6 at which clock signal /CLK rises to H level is a setup time for input signal IN.

At time t6, after clock signal CLK falls to L level and clocked inverter CIV is driven to an inactive state, clock signal /CLK rises to H level. Then, MOS transistor 5 is turned on and input signal IN is transmitted to internal node DN7. Accordingly, the voltage level of internal node DN7 changes to the voltage level (3 V) corresponding to H level of input signal IN. After this, an operation similar to the operation starting at time t0 is carried out repeatedly.

Here, at time t6, in response to the fall of clock signal CLK, the voltage level of internal node DN7 temporarily falls to the ground voltage level and then is driven to H level (VIH) of input signal IN according to input signal IN.

As discussed above, MOS capacitor 6 is connected to internal node DN7, input signal IN is transmitted to internal node DN7 to bring internal node DN7 into an electrically floating state, and then MOS capacitor 6 is driven by the clock signal to effect the charge pump operation. In this way, the voltage level of internal node DN7 can be increased accurately up to the voltage level that allows clocked inverter CIV, which receives the internal power supply voltage VDD as an operating power-supply voltage, to normally operate. When the voltage level of internal node DN7 is increased, merely the charge pump operation of the MOS capacitor is used and no current consumption occurs. Similarly, when internal node DN7 is driven to L level, generation of the MOS capacitance is prevented. Thus, the voltage level of the internal node can be changed at a high speed and accordingly an internal signal ca be generated though high-speed level conversion of the input signal.

Second Embodiment

Figure 4:
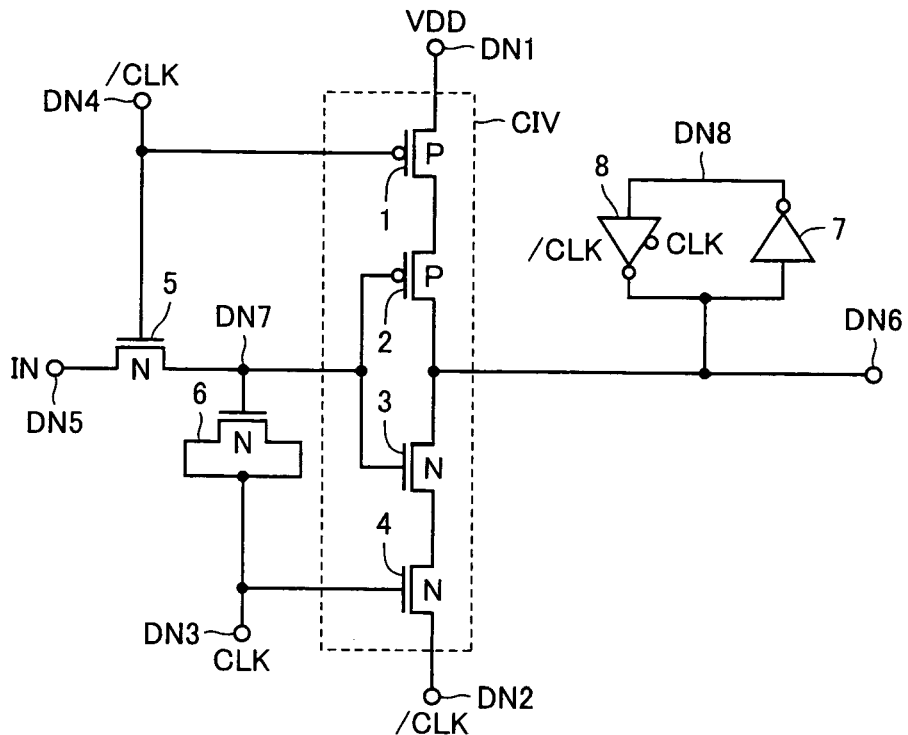
FIG. 4 shows a configuration of a level conversion circuit according to a second embodiment of the present invention.

FIG. 4 shows a configuration of a level conversion circuit according to a second embodiment of the present invention. The configuration of the level conversion circuit shown in FIG. 4 differs from that of the level conversion circuit shown in FIG. 1 in that, to low-side power supply node DN2 of clocked inverter CIV, clock signal /CLK is applied instead of the measurement reference voltage (ground voltage VSS). Other configuration of the level conversion circuit shown in FIG. 4 is identical to that of the level conversion circuit shown in FIG. 1. Therefore, like components are denoted by like reference numerals and the detailed description thereof is not repeated.

In the level conversion circuit shown in FIG. 4, clock signal CLK changes with a delay to clock signal /CLK.

Figure 5:
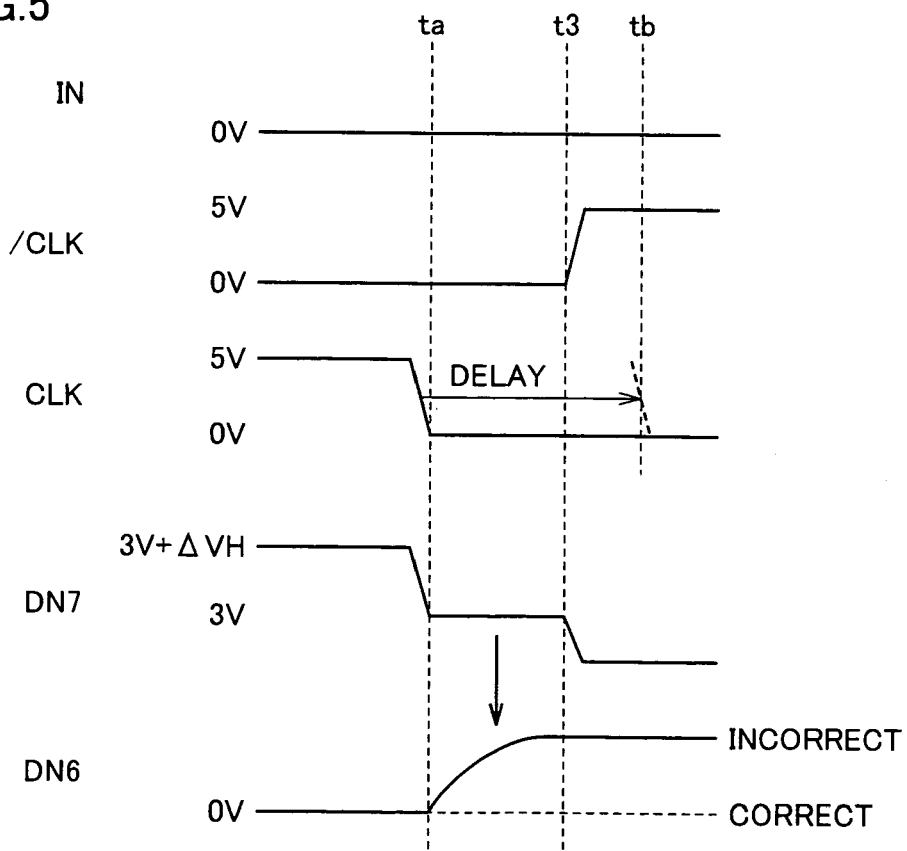
FIG. 5 illustrates an operational timing margin of the level conversion circuit shown in FIG. 4.

FIG. 5 is a signal waveform diagram representing an operation of the level conversion circuit shown in FIG. 4 in the case where the clock skew large. As shown in FIG. 5, it is assumed now that input signal IN is at L level (0 V), clock signal CLK is at H level and clock signal /CLK is at L level. It is further assumed that, in this state, internal node DN7 is kept at the boosted voltage (3 V+ΔVH) level.

Then, it is assumed that, at time ta, clock signal CLK falls from H level to L level while clock signal /CLK is at L level. At this time, MOS transistor 5 is in a turned-off state, so that through the charge pump operation of MOS capacitor 6, the voltage level of internal node DN7 decreases to H level (3 V) of input signal IN. Since clock signal /CLK is at L level, P-channel MOS transistor 1 of clocked inverter CIV is in a turned-on state. If power supply voltage VDD is 5 V, the gate-to-source voltage of MOS transistor 2 is –2 V. When the threshold voltage of MOS transistor 2 varies to a large degree and is –1.5 V, for example, MOS transistor 2 is turned on to and internal node DN6 is charged to have the voltage level increased. At this time, if inverter 7 operates to drive internal node DN8 to L level according to the voltage level of internal output node DN6, in clocked inverter 8, P-channel MOS transistors for charging are turned on according to L level of clock signal CLK to drive internal output node DN6 to H level.

At time t3, clock signal /CLK rises to H level. Responsively, clocked inverter CIV is inactivated and enters an output high impedance state. At this time, even if internal node DN7 is driven to L level (ground voltage level) by input signal IN applied via MOS transistor 5, internal node DN6 is kept at H level since clocked inverter CIV is in the inactive state. Therefore, H level is outputted from internal output node DN6 which should be kept at L level in a correct operation, resulting in malfunction. In order to prevent the timing margin of the clock signal from decreasing due to the above-described skew of the clock signals, fall of clock signal CLK is delayed relative to rise of clock signal /CLK.

Figure 6:
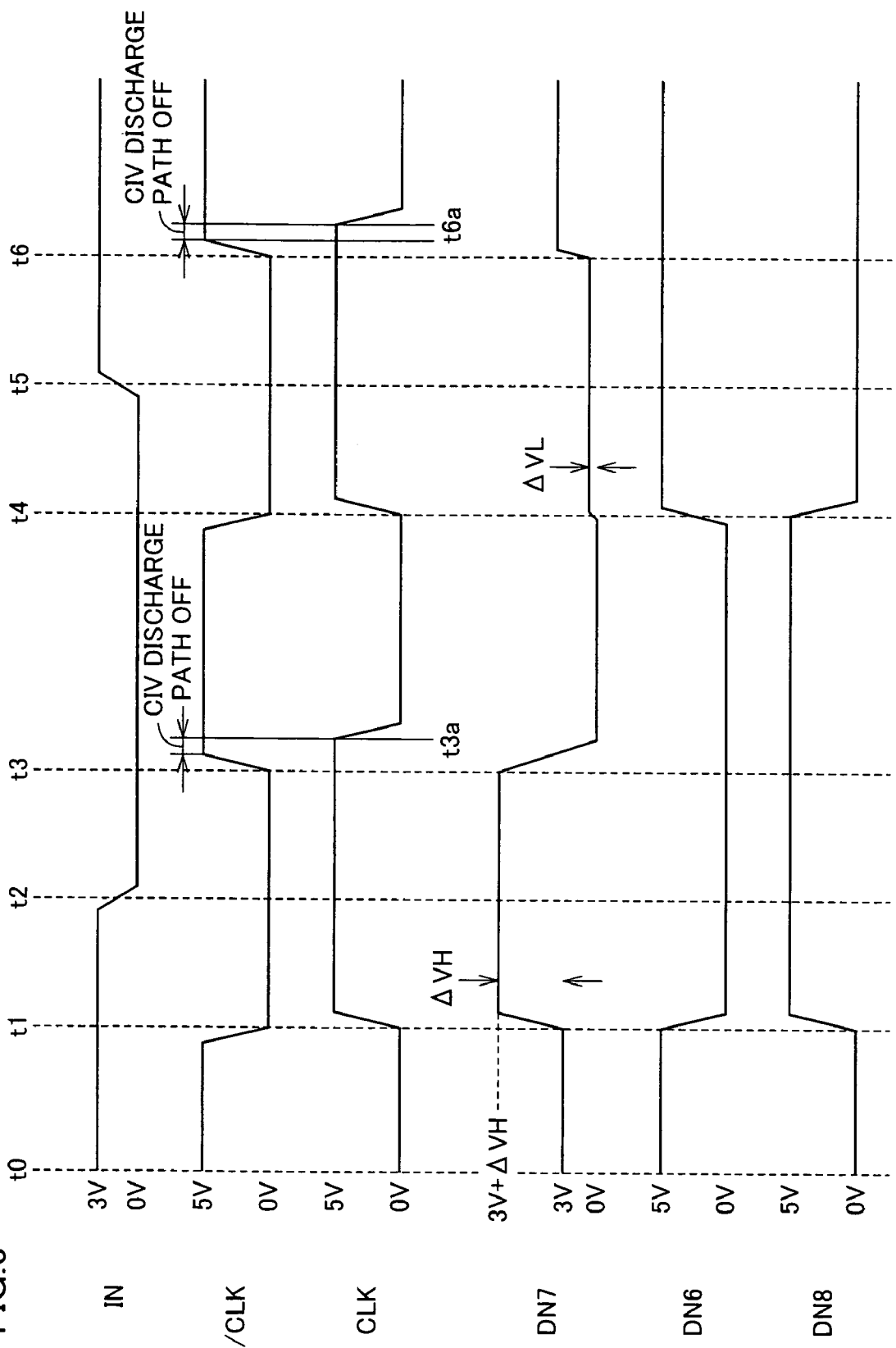
FIG. 6 is a timing diagram representing an operation of the level conversion circuit shown in FIG. 4.

FIG. 6 is a signal waveform diagram representing an operation of the level conversion circuit shown in FIG. 4. With reference to FIG. 6, a description is now given of the operation of the level conversion circuit shown in FIG. 4.

In the period from time t0 to time t2, the operation is similar to that represented by the signal waveform diagram shown in FIG. 3. Specifically, at time t2, input signal IN falls from H level to L level and input signal IN is set up.

At this time, internal node DN7 is at the voltage level equal to the boosted voltage 3 V+ΔVH, internal output node DN6 is at L level and internal node DN8 is at H level.

At time t3, internal clock signal /CLK rises from L level to H level. At this time, clock signal CLK is at H level. Accordingly, MOS transistor 5 is turned on and internal node DN7 is driven to the ground voltage level according to input signal IN. In this operation, both of the clock signals CLK and /CLK are at H level, the gate potential and the source potential of MOS transistor 4 are equal to each other and the MOS transistor 3 is kept non-conductive according to the voltage level of internal node DN7. P-channel MOS transistor 1 is kept off. Accordingly, clocked inverter CIV is in an inactive state in the period in which both of the clock signals CLK and /CLK are at H level. Even if the voltage level of internal node DN8 lowers, internal output node DN6 maintains L level without the influence of such voltage lowering.

At time t3a, clock signal CLK falls to L level. Accordingly, MOS transistor 4 is driven to a deeply off state. Since internal node DN7 is coupled to input node DN5, internal node DN7 is kept at the voltage level equal to the voltage level of input signal IN even when clock signal CLK falls.

At time t4, clock signal /CLK falls from H level to L level and thereafter clock signal CLK rises from L level to H level. When clock signal CLK rises to H level, clocked inverter CIV is activated since clock signal /CLK on low-side power supply node DN2 is at L level. The voltage level of internal node DN7, however, is L level and no capacitance is formed in MOS capacitor 6, so that the voltage level of internal node DN7 increases only by voltage ΔVL and is kept at L level. In response to fall of clock signal /CLK at time t4, clocked inverter CIV is activated to drive internal output node DN6 to H level (5 V).

At time t5, input signal IN rises from L level to H level.

At time t6, clock signal /CLK rises from L level to H level. At this time, clock signal CLK is kept at H level. Clock signal CLK falls to L level at time t6a. In the period from time t6 to time t6a, MOS transistor 4 of clocked inverter CIV is kept in the turned-off state. Accordingly, the voltage level of internal node DN7 increases to the voltage level of 3 V according to H level of input signal IN. Even when MOS transistor 3 is turned on, the discharge path of clocked inverter CIV is shut off so that the voltage level of internal output node DN6 is kept at H level.

At time t6a at which clock signal CLK falls to L level, MOS transistor 4 of clocked inverter CIV is turned off and the discharge path is surely shut off.

In this way, clock signal CLK is changed with a delay to clock signal /CLK, accurately input signal IN is sampled and level converted, to generate an internal signal. Sampling here refers to the operation of taking in and latching an input signal. In other words, when the condition that clock signal CLK changes with a delay to clock signal /CLK is satisfied, it is insured that the level conversion is accurately performed and the level-converted signal is output and accordingly the level conversion circuit shown in FIG. 4 can increase the timing margin.

In order for MOS capacitor 6 to carry out the charge pump operation and change the voltage level, it is required that MOS transistor 5 is in a turned-off state and internal node DN7 is maintained in an electrically floating state. Thus, by raising clock signal CLK to H level after clock signal /CLK falls, MOS capacitor 6 can perform the voltage boosting thorough the charge pump operation.

Figure 7:
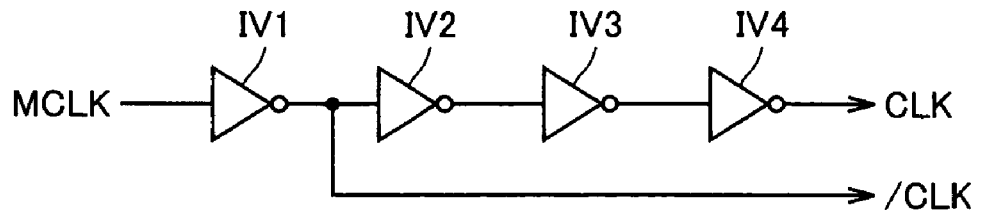
FIG. 7 shows an exemplary configuration of a section for generating two-phase clock signals shown in FIG. 4.

FIG. 7 shows an example of a configuration of a section that generates the clock signals in the second embodiment of the present invention. Referring to FIG. 7, the clock signal generation section includes, by way of example, cascaded inverters IV1 to IV4 of even-numbered stages (four stages in FIG. 7) receiving a main clock signal MCLK. From inverter IV1 of the first stage, complementary clock signal /CLK is generated and, from inverter IV4 of the last stage, clock signal CLK is generated.

Main clock signal MCLK is an externally applied clock signal to define the clock cycle at which input signal IN is applied. With the configuration of the clock signal generation circuit shown in FIG. 7, clock signal /CLK is delayed by the delay time of inverters IV2 to IV4 and further inverted to generate clock signal CLK. Clock signal CLK can thus be changed all the time after clock signal /CLK is changed, so that the level conversion of input signal IN can accurately be performed.

Alternatively, clock signals CLK and /CLK may be generated through phase adjustment by means of a circuit such as PLL (Phase Locked Loop).

As discussed above, according to the second embodiment of the present invention, to the low-side power supply node of the clocked inverter that level-converts the input signal, the clock signal defining sampling timing (timing at which the input signal is taken in and latched or the timing at which MOS transistor 5 is turned off) is applied. Accordingly, the timing margin of the clock signals of the level conversion circuit can be-increased, and the input signal can be taken in to be level-converted accurately to generate an input signal.

Third Embodiment

Figure 8:
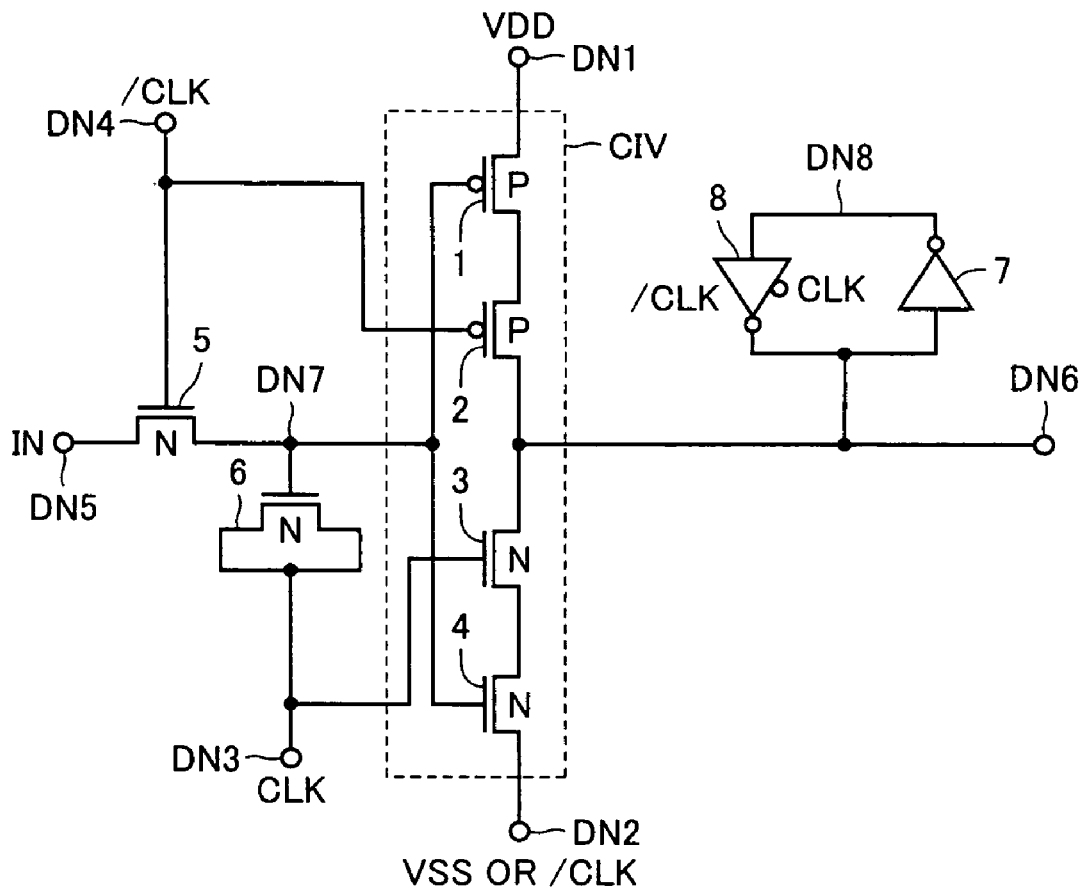
FIG. 8 shows a configuration of a level conversion circuit according to a third embodiment of the present invention.

FIG. 8 shows a configuration of a level conversion circuit according to a third embodiment of the present invention. The configuration of the level conversion circuit shown in FIG. 8 differs from that of the level conversion circuit shown in FIG. 1 or 4 in that, the gate of P-channel MOS transistor 1 of clocked inverter CIV that is connected to high-side power supply node DN1 is connected to internal node DN7 and clock signal /CLK is applied to the gate of P-channel MOS transistor 2 connected to internal output node DN6. Similarly, clock signal CLK is applied to the gate of N-channel MOS transistor 3 and the gate of N-channel MOS transistor 4 connected to low-side power supply node DN2 is connected to internal node DN7. Further, to low-side power-supply node DN2, reference voltage VSS or clock signal /CLK is applied. Other configuration of the level conversion circuit shown in FIG. 8 is identical to the level conversion circuit shown in FIG. 1 or 4. Therefore, like components are denoted by like reference numerals and the detailed description thereof is not repeated.

Specifically, clock signals /CLK and CLK are applied to the respective gates of MOS transistors 2 and 3 of clocked inverter CIV that are connected to internal output node DN6. In an operation period in which clock signal /CLK is at H level, clock signal CLK is at L level and input signal IN is input, MOS transistors 2 and 3 are in a turned-off state. The capacitive coupling between nodes DN6 and DN7 is thus suppressed sufficiently and any influence of a voltage-level change of internal node DN7 on the voltage level of internal output node DN6 can be suppressed.

When internal node DN6 is in an electrically floating state after sampling, even if the voltage level of internal output node DN6 is changed by clocked inverter CIV, the capacitive coupling between nodes DN7 and DN6 via parasitic capacitances of MOS transistors 1 and 4 can be suppressed. The voltage level of internal node DN7 can thus be kept at a voltage level according to the sampled input signal.

Further, when MOS transistors 2 and 3 are in a turned-off state, only each respective drain junction capacitance is connected to internal output node DN6. Load on internal output node DN6 when clocked inverter CIV is inactivated, can be reduced, so that internal output node DN6 can be driven at a high speed by clocked inverter 8.

As discussed above, according to the third embodiment of the present invention, the MOS transistors receiving the clock signals at their gates are connected to the internal output node of the level-conversion clocked inverter. Accordingly, the capacitive coupling between the internal nodes via the MOS transistors of the level-converting clocked inverter CIV can be mitigated so that the internal node can be maintained in a stable manner at a voltage level according to the sampled input signal.

Fourth Embodiment

Figure 9:
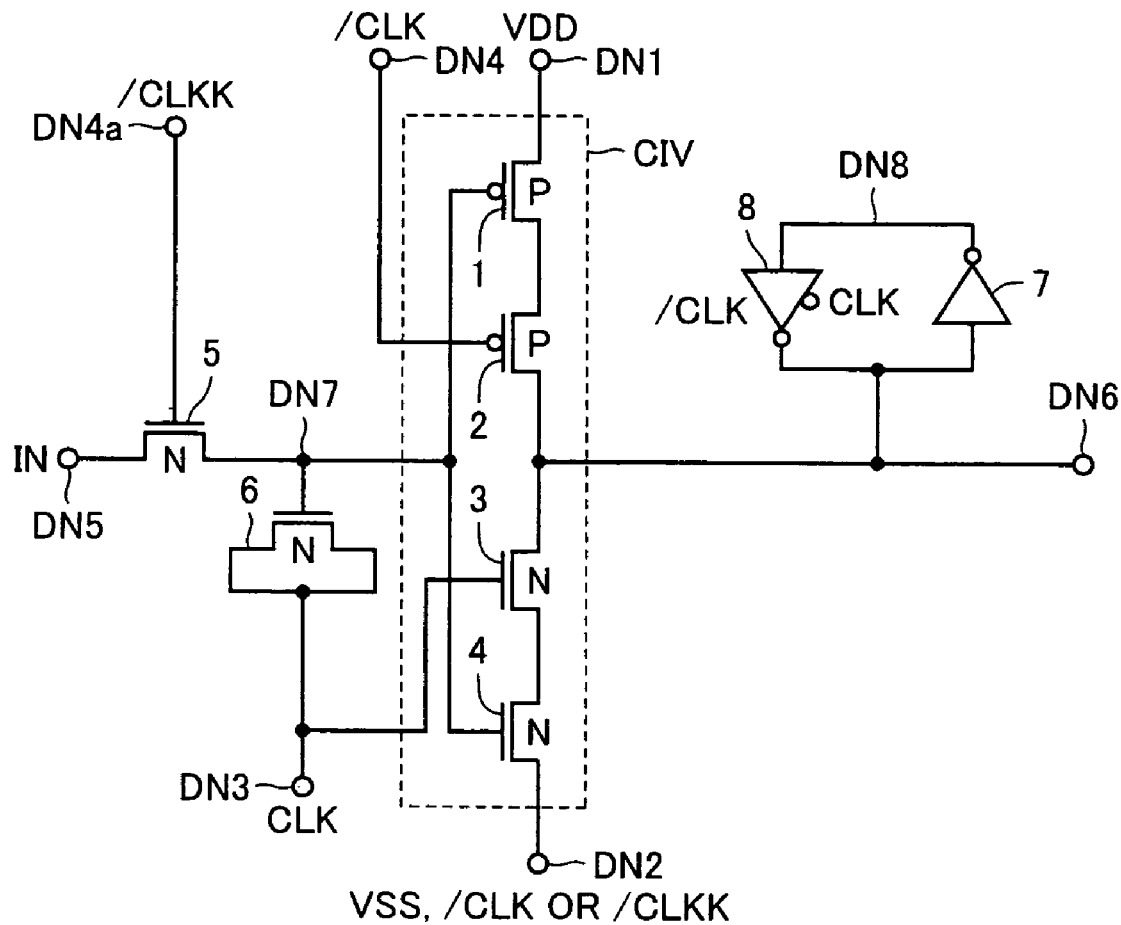
FIG. 9 shows a configuration of a level conversion circuit according to a fourth embodiment of the present invention.

FIG. 9 shows a configuration of a level conversion circuit according to a fourth embodiment of the present invention. The level conversion circuit shown in FIG. 9 differs in configuration from the level conversion circuit shown in FIG. 8 in that a clock signal /CLKK is applied via a clock input node DN4*a* to the gate of sampling N-channel MOS transistor 5. H level of this clock signal /CLKK is a voltage level higher than H level of clock signal /CLK. Other specific configuration of the level conversion circuit shown in FIG. 9 is identical to the level conversion circuit shown in FIG. 8. Therefore, like components are denoted by like reference numerals and the detailed description thereof is not repeated.

Figure 10:
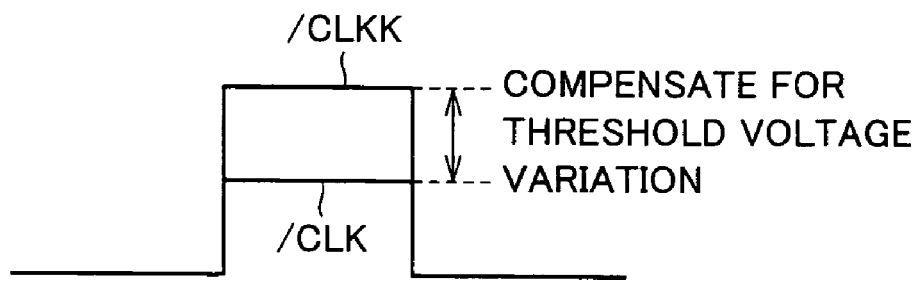
FIG. 10 shows voltage amplitude of a clock signal shown in FIG. 9.

When MOS transistor 5 has the threshold voltage varied to a large value, H level of clock signal /CLKa would cause a threshold voltage loss, and such a case may possibly result that input signal IN cannot fully be transmitted to internal node DN6. In order to prevent the threshold voltage loss, clock signal /CLKK with its H level made sufficiently high to the degree that the variation of the threshold voltage can be compensated for, is applied to the gate of sampling N-channel MOS transistor 5, as shown in FIG. 10. Accordingly, even if the threshold voltage of MOS transistor 5 varies to some degree, it is ensured that input voltage IN is fully transmitted to internal node DN6.

When clock signal /CLKK of a large amplitude is used, this large-amplitude clock signal /CLKK may be applied to low-side power supply node DN2 of clocked inverter CIV. In this way, since it is necessary to supply a ground voltage to low-side power supply node DN2, the degree of freedom of the layout can be improved.

In the configuration of this level conversion circuit shown in FIG. 9, MOS transistors 2 and 3 having respective gates receiving clock signals /CLK and CLK are connected to internal output node DN6. The configuration employing this large-amplitude clock signal /CLKK, however, may be used in the configuration shown in FIG. 1 or 4.

As discussed above, according to the fourth embodiment of the present invention, the clock signal having large amplitude is applied to the gate of the sampling MOS transistor. Even if the threshold voltage varies, input signal IN can surely be transmitted to the internal node without being accompanied by the threshold voltage loss.

Fifth Embodiment

Figure 11:
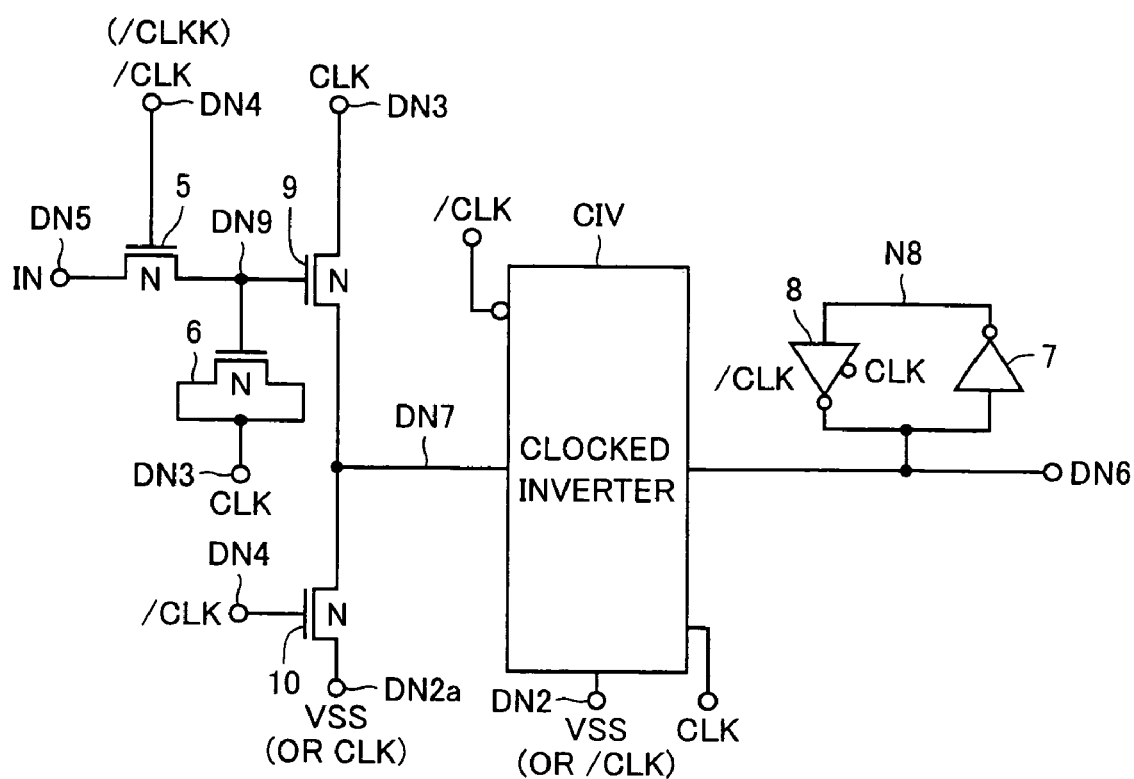
FIG. 11 shows a configuration of a level conversion circuit according to a fifth embodiment of the present invention.

FIG. 11 shows a configuration of a level conversion circuit according to a fifth embodiment of the present invention. The level conversion circuit shown in FIG. 11 selectively transmits clock signal CLK to internal node (input node of clocked inverter CIV) DN7 according to a charged voltage of MOS capacitor 6. Specifically, the level conversion circuit shown in FIG. 11 includes N-channel MOS transistor 5 transmitting input signal IN applied to input node DN5 to internal node DN9 according to complementary clock signal /CLK from clock input node DN4, MOS capacitor 6 selectively forming a capacitance according to the potential difference between clock signal CLK on clock input node DN3 and internal node DN9, N-channel MOS transistor 9 selectively transmitting clock signal CLK on clock input node DN3 to internal node DN7 according to the voltage on internal node DN9, N-channel MOS transistor 10 driving internal node DN7 to the voltage level of low-side power supply node DN2 according to clock signal /CLK, clocked inverter CIV performing level conversion on a signal to transmit the level-converted signal to internal output node DN6 according to the signal on internal node DN7, and clocked inverters 7 and 8 constituting a latch circuit latching the signal on internal output node DN6.

Clocked inverter CIV has any of the configurations of clocked inverters of the first to fourth embodiments respectively. Clocked inverter CIV is activated when clock signals CLK and /CLK are at H and L levels, respectively, to drive internal output node DN6 according to the signal on internal node DN7. Clocked inverter CIV is in an inactive state and accordingly in an output high impedance state when clock signals CLK and /CLK are at L level and H level, respectively.

Clock signals CLK and /CLK each have the amplitude larger than that of input signal IN. The relation in voltage amplitude as described in connection with the first to fourth embodiments holds between clock signals CLK and /CLK and input signal IN.

Measurement reference voltage VSS is applied to source node DN2*a* of N-channel MOS transistor 10 serving as a low drive circuit for driving internal node DN7 to L level. As described later, a clock signal may be applied to this source node DN2*a*.

The latching operation performed by clocked inverter 8 and inverter 7 is the same as that described in connection with the first to fourth embodiments.

Figure 12:
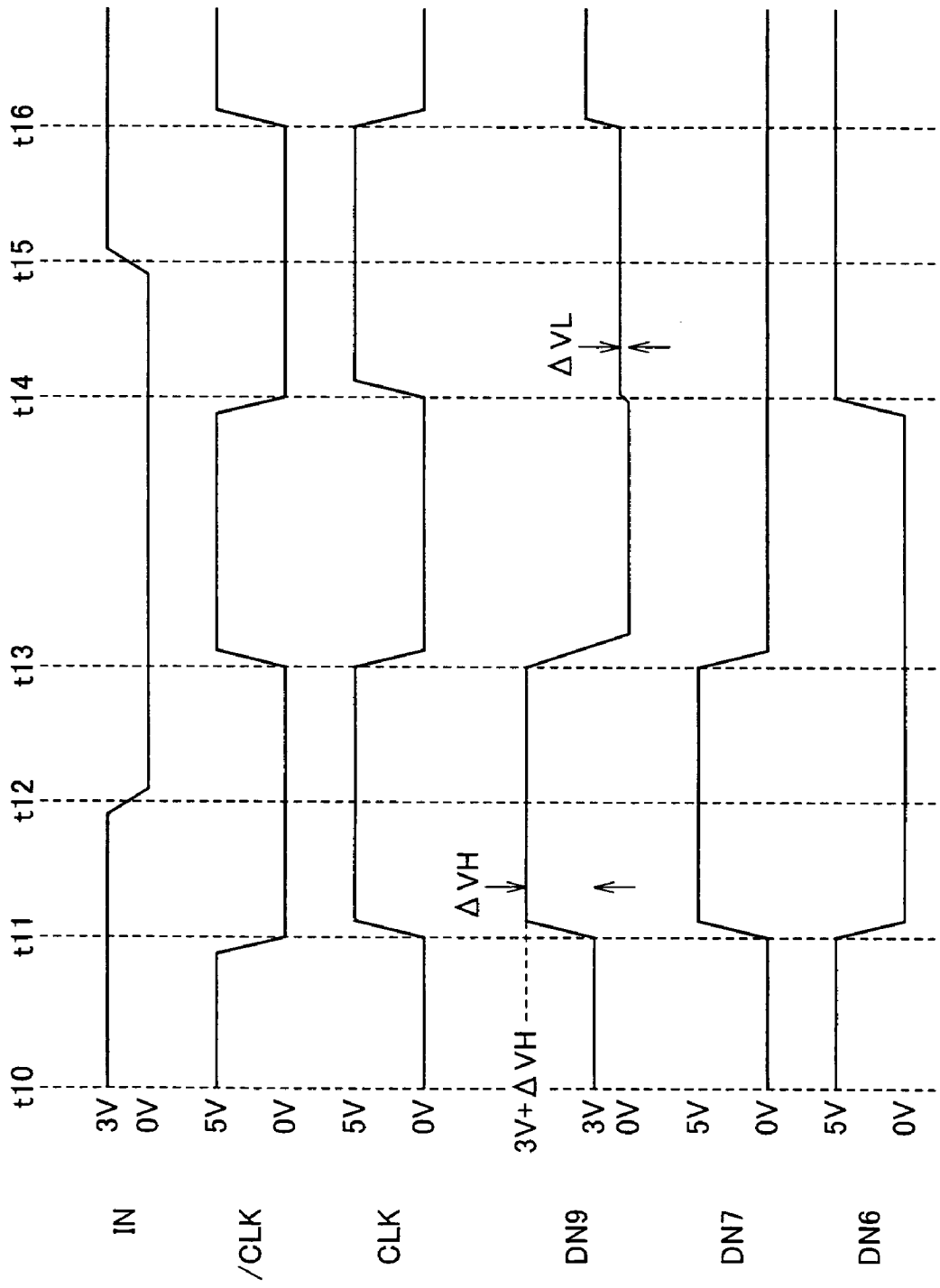
FIG. 12 is a timing diagram representing an operation of the level conversion circuit shown in FIG. 11.

FIG. 12 is a signal waveform diagram representing an operation of the level conversion circuit shown in FIG. 11. The operation of the level conversion circuit shown in FIG. 11 is now described with reference to FIG. 12.

It is assumed here that, at time t10, input signal IN is at H level (3 V), clock signal /CLK is at H level (5 V) and clock signal CLK is at L level (0 V). In this state, MOS transistor 5 is in a turned-on state, and input signal IN is transmitted to internal node DN9 so that the level of internal node DN9 is at H level (3 V). Clock signal CLK is at L level so that MOS transistor 9 is turned on and L level (ground voltage level) is transmitted to internal node DN7. Clocked inverter CIV is in an inactive state so that internal output node DN6 is maintained by inverter 7 and clocked inverter 8 at H level (5 V).

At time t11, clock signal /CLK falls to L level and subsequently clock signal CLK rises to H level. MOS transistor 5 is turned off and internal node DN9 is in a floating state. At this time, MOS capacitor 6 has a channel generated to operate as a MOS capacitance for supplying electric charges to internal node DN9 through its charge pump operation in response to the rise of clock signal CLK. Accordingly, the voltage level of internal node DN9 increases by ΔVH. The voltage level resulting from the voltage increase ΔVH on node DN9 is a voltage level sufficiently higher than H level of clock signal CLK. MOS transistor 9 is thus turned on to transmit clock signal CLK of H level to internal node DN7 so that the voltage level of internal node DN7 attains H level. In this operation, MOS transistor 10 is in a turned-off state. Since clocked inverter CIV is in the active state, clocked inverter CIV transmits the signal of L level to internal output node DN6 according to the H level signal on internal node DN7.

At time t12, input signal IN falls to L level. At this time, clock signal/CLK is at L level, MOS transistor 5 is in the turned-off state, and a setup is made for a sampling operation of input signal IN.

At time t13, clock signal /CLK rises to H level and input signal IN on input node DN5 is transmitted to internal node DN9, so that the voltage level of internal node DN9 is L level identical to that of input signal IN. Further, in response to the rise of clock signal /CLK, MOS transistor 10 is turned on to discharge internal node DN7 to ground voltage VSS level. When clock signal CLK falls, MOS transistor 5 is in the turned-on state and internal node DN9 is not in the electrically floating state. Therefore, no charge pump operation by MOS capacitor 6 is carried out and internal node DN9 is kept at L level of input signal IN.

In this state, clocked inverter CIV is in an inactive state, internal node DN7 and internal output node DN6 are isolated from each other and internal node DN6 is kept at L level.

At time t14, clock signal /CLK falls to L level and subsequently clock signal CLK rises to H level. At this time, internal node DN9 is at L level so that no channel is generated in MOS capacitor 6. Accordingly, in response to the rise of clock signal CLK, the voltage level of internal node DN9 increases by $\Delta VL$ by a parasitic capacitance of MOS capacitor 6. This voltage $\Delta VL$, however, is sufficiently smaller than the threshold voltage of MOS transistor 9 so that MOS transistor 9 remains in the turned-off state. Internal node DN7 is at L level. In response to the fall of clock signal /CLK, the charging operation of clocked inverter CIV is activated, so that this final output node DN6 is driven to H level of 5 V.

At time t15, input signal IN rises from L level to H level again for setup of input signal IN.

At time t16, clock signal /CLK rises to H level and sampling of input signal IN is started. After this, the operation from time t10 is repeated.

In the level conversion circuit shown in FIG. 11, node DN9 is connected to the gate of MOS transistor 9 and accordingly the parasitic capacitance of internal node DN9 can be made small. Thus, the capacitance value CST of the parasitic capacitance in equation (1) can be decreased, voltage increase amount $\Delta VH$ can be large, so that the signal at power supply voltage VDD level can accurately be transmitted to input node DN7 of clocked inverter CIV.

In the configuration of the level conversion circuit shown in FIG. 11, clock signal /CLKK of large amplitude maybe applied to the gate of MOS transistor 5. To source node DN2a of MOS transistor 10 constituting the low drive circuit, clock signal CLK may be applied. When internal node DN7 is discharged to L level, clock signal /CLK is at H level and clock signal CLK is at L level. Therefore, internal node DN7 can surely be driven to L level. At this time, to low-side power supply node DN2 of clocked inverter CIV, clock signal /CLK has to be applied (see FIG. 4, for surely shutting off the discharging path).

As discussed above, according to the fifth embodiment of the present invention, MOS transistor 9 is driven in accordance with the charged voltage of MOS capacitor 6 that boosts the sampled input signal, to transmit the clock signal via the internal node to clocked inverter CIV. Accordingly, the parasitic capacitance of internal node DN9 to which MOS capacitor 6 is connected can be reduced. The boosting operation of the sampled input signal can efficiently be performed, the level-converted signal can be transmitted to the clocked inverter, and the level-converted signal can surely be transmitted to the clocked inverter.

Sixth Embodiment

Figure 13:
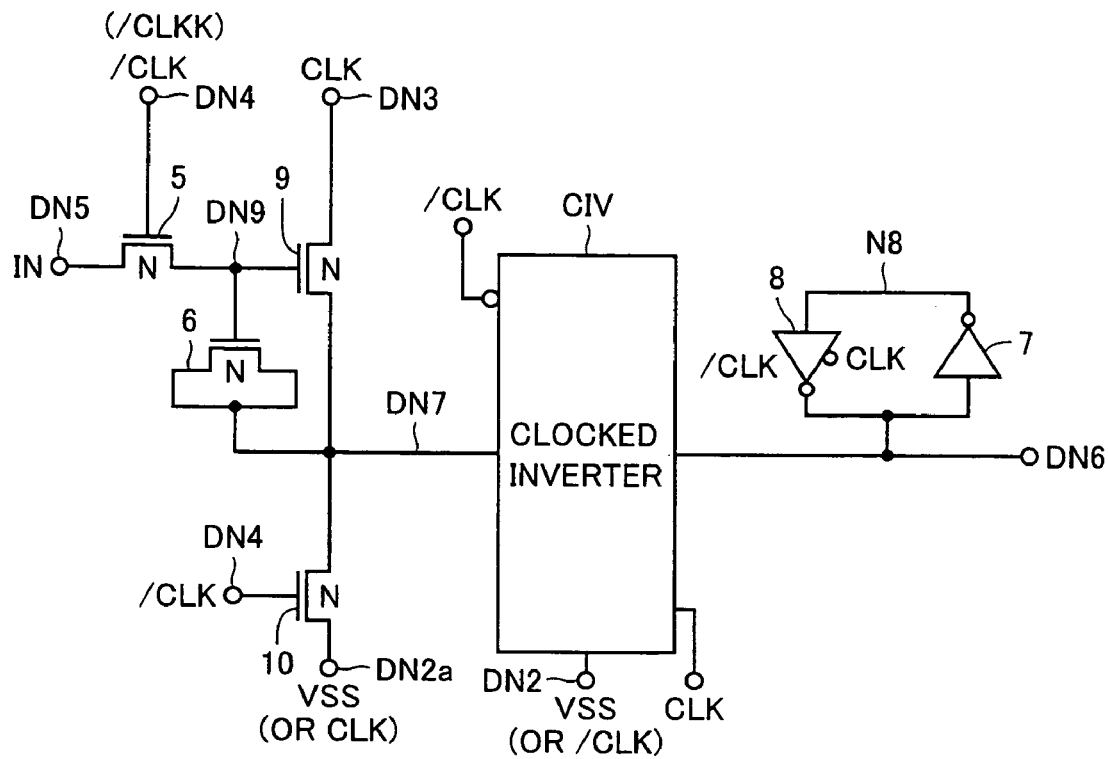
FIGS. 13 to 15 show respective configurations of the level conversion circuits according to sixth to eighth embodiments of the present invention.

FIG. 13 shows a configuration of a level conversion circuit according to a sixth embodiment of the present invention. The level conversion circuit shown in FIG. 6 differs in configuration from shown in FIG. 11 in that the source and drain nodes of a MOS transistor constituting MOS capacitor 6 of the level conversion circuit shown in FIG. 13 is connected to internal node DN7 which in turn is connected to the input of clocked inverter CIV. Other specific configuration of the level conversion circuit shown in FIG. 13 are identical to the level conversion circuit shown in FIG. 11. Therefore, like components are denoted by like reference numerals and the detailed description thereof is not repeated.

In the configuration of the level conversion circuit shown in FIG. 13, in the state where internal node DN9 is at the H level (3 V) of input signal IN, clock signal /CLK falls to L level and subsequently clock signal CLK rises to H level, and MOS transistor 9 in a weakly-on state transmits clock signal CLK to internal node DN7 so that the voltage level of internal node DN7 increases. According to the increase in voltage level of internal node DN7, the voltage level of internal node DN9 increases through the capacitive coupling of MOS capacitor 6. MOS transistor 9 enters a further deeply on state so that MOS transistor 9 transmits H level of clock signal CLK to internal node DN7. By the positive feedback operation of MOS capacitor 6, the voltage level of internal node DN7 can be increased at high speed.

When internal node DN9 is at L level, MOS transistor 9 remains in the turned-off state. Even if clock signal CLK rises to H level, internal node DN7 maintains the floating state of L level.

The level conversion circuit shown in FIG. 13 uses no clock signal for driving MOS capacitor 6. Therefore, no clock signal line to MOS capacitor 6 is necessary and thus the layout design is facilitated.

Seventh Embodiment

Figure 14:
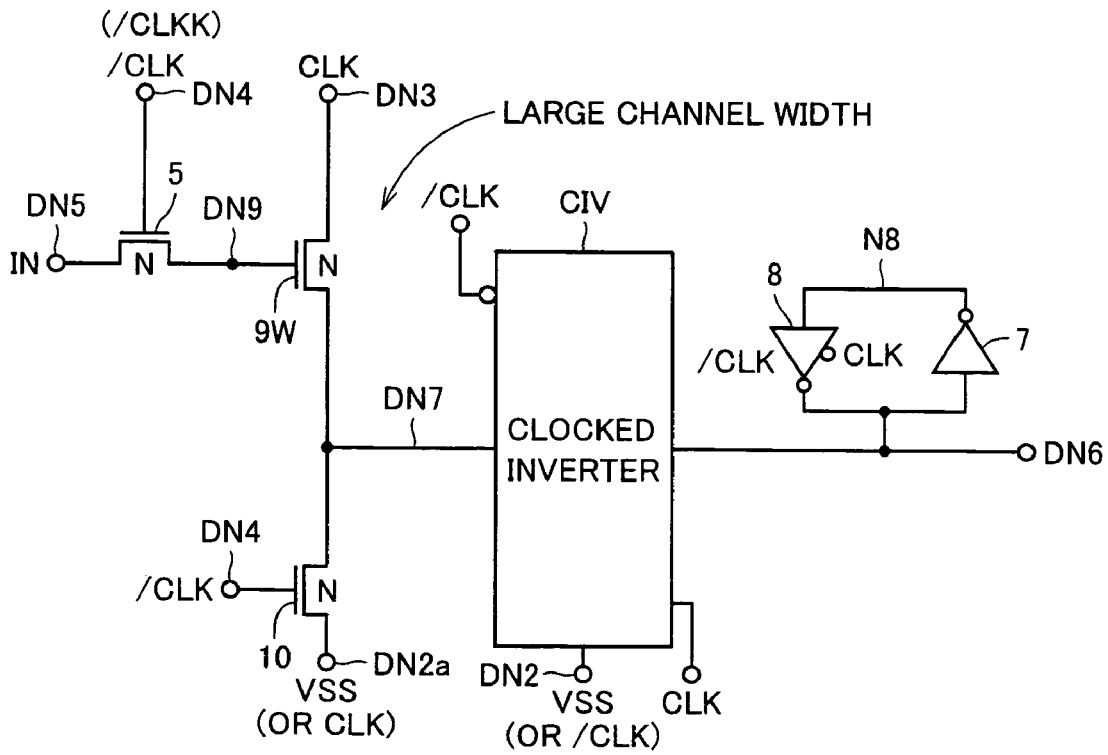

FIG. 14 shows a configuration of a level conversion circuit according to a seventh embodiment of the present invention. The level conversion circuit shown in FIG. 14 differs in configuration from the level conversion circuits shown in FIGS. 11 and 13 in that no MOS capacitor 6 is provided. Specifically, in order to operate MOS transistor 9 having its gate connected to internal node DN9 as a MOS capacitor, an N-channel MOS transistor 9W with its channel width sufficiently made large is employed. Other specific configuration of the level conversion circuit shown in FIG. 14 are identical to the level conversion circuit shown in FIGS. 11 and 13. Therefore, like components are denoted by like reference numerals and the detailed description thereof is not repeated.

In the level conversion circuit shown in FIG. 14, when internal node DN9 is at H level while clock signal /CLK falls to L level and thereafter clock signal CLK rises to H level, a channel is formed in MOS transistor $9w$. A capacitor between this channel region and the gate causes the voltage level of internal node DN9 to increase so that clock signal CLK at H level is transmitted to internal node DN7. In other words, the self-bootstrap function of this MOS transistor $9w$ is used to increase the voltage level of internal node DN9 according to the rise of clock signal CLK. In this way, clock signal CLK is transmitted to internal node DN7 without loss of the threshold voltage of MOS transistor $9w$.

When internal node DN9 is at L level, MOS transistor $9w$ is in a turned-off state. Even if clock signal CLK rises, the voltage level of internal node DN9 increases by only a small amount because of the presence of a gate-drain capacitor of MOS transistor $9w$. Then, MOS transistor $9w$ remains in the turned-off state while internal node DN7 is maintained at L level.

In the configuration of the level conversion circuit shown in FIG. 14, MOS transistor $9w$ transmitting the level-converted signal is operated as a MOS capacitor. Therefore, a separate MOS capacitor for voltage boosting is unnecessary. The layout area is thus reduced and the degree of freedom of layout is improved. Moreover, since the channel width of MOS transistor $9w$ is made large, the current drivability is large so that internal node DN7 can be driven to H level at a high speed.

Eighth Embodiment

Figure 15:
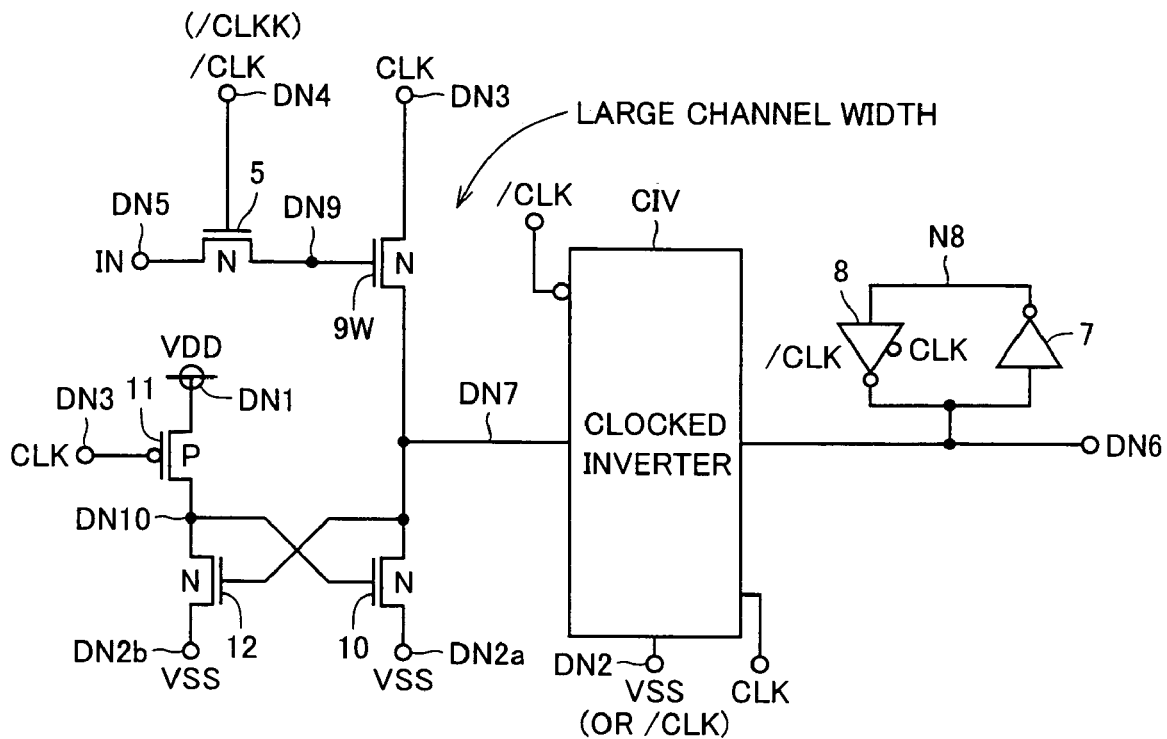

FIG. 15 shows a configuration of a level conversion circuit according to an eighth embodiment of the present invention. The level conversion circuit shown in FIG. 15 differs in configuration from the low drive circuit for driving internal node DN7 to L level shown in FIG. 14 in the following points. Specifically, as this low drive circuit, there are further provided a P-channel MOS transistor 11 connected between power supply node DN1 and internal node DN10 and having its gate receiving clock signal CLK from clock input node DN3 and an N-channel MOS transistor 12 connected between internal node DN10 and low-side power supply node DN2b and having its gate connected to internal node DN7. The gate of MOS transistor 10 is connected to internal node DN10.

Other specific configuration of the level conversion circuit shown in FIG. 15 is identical to the level conversion circuit shown in FIG. 14. Therefore, like components are denoted by like reference numerals and the detailed description thereof is not repeated.

In the configuration of the level conversion circuit shown in FIG. 15, when clock signal CLK is at L level, MOS transistor 11 is turned on and internal node DN10 is driven to H level. Accordingly, MOS transistor 10 is turned on and internal node DN7 is driven to the voltage level on low-side power supply node DN2a, or ground voltage VSS level. Since internal node DN7 is connected via MOS transistor 10 to low-side power supply node DN2a, it can be prevented that internal node DN7 enters an electrically floating state when clock signal CLK is at L level. Thus, superimposition of noise on internal node DN7 can be prevented.

When clock signal CLK is at L level, clock signal /CLK is at H level. Then, input signal IN is transmitted to internal node DN9. After clock signal /CLK falls to L level and internal node DN9 enters an electrically floating state, clock signal CLK rises to H level. Accordingly, MOS transistor 11 is turned off. When input signal IN is at H level, the voltage level on internal node DN9 increases in response to the rise of clock signal CLK. Accordingly, the voltage level on internal node DN7 increases to H level (5 V). According to the increase in voltage level of internal node DN7, MOS transistor 12 transitions to a turned-on state to drive internal node DN10 to L level and MOS transistor 10 is responsively driven to a turned-off state. In this way, sampled input signal IN can surely be level-converted and transmitted to internal node DN7.

When sampled input signal IN is at L level, MOS transistor 9w is in a turned-off state and thus clock signal CLK is not transmitted via MOS transistor 9w to internal node DN7. In this state, MOS transistor 12 is in a turned-off state while MOS transistor 10 remains in a turned-on state. Internal node DN7 is kept at voltage VSS level on low-side power supply node DN2a. Accordingly, in this state, it can still be prevented that internal node DN7 enters an electrically floating state. Thus, internal node DN7 can stably be kept at the ground voltage level.

It is noted that, in the shown configuration, there is a possibility that in response to application of clock signal CLK to low-side power supply node DN2a, clock signal CLK at H level is transmitted via MOS transistor 10 when internal node DN7 is at L level, and the voltage level of internal node DN7 is erroneously changed. Therefore, in the configuration shown in FIG. 15, low-side power supply node DN2a is kept at measurement reference voltage VSS level.

In the level conversion circuit shown in FIG. 15, a voltage-boosting MOS capacitor may be connected to internal node DN9.

As discussed above, according to the eighth embodiment of the present invention, the low drive circuit is used to maintain node DN7 at L level with low impedance when the L level signal is transmitted to input node DN7 of clocked inverter CIV. Thus, a potential increase of internal node DN7 due to noise can be prevented and accordingly a malfunction of clocked inverter CIV can be prevented.

Ninth Embodiment

Figure 16:
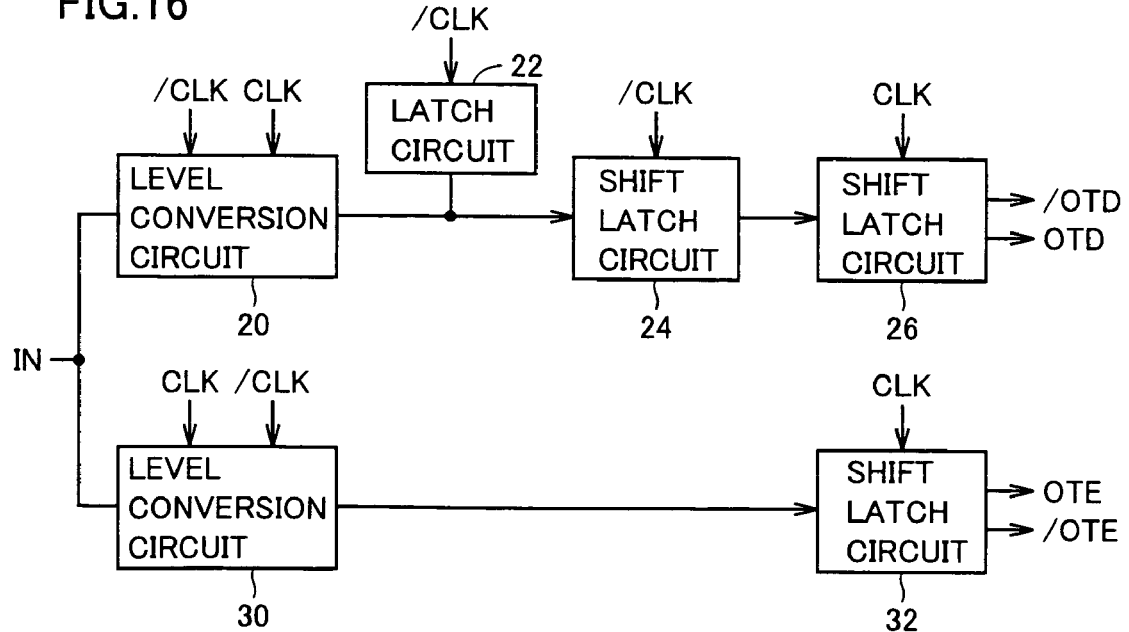
FIG. 16 schematically shows a configuration of a serial/parallel conversion circuit with level conversion function according to a ninth embodiment of the present invention.

FIG. 16 schematically shows a configuration of a serial/parallel conversion circuit with level conversion function according to a ninth embodiment of the present invention. Referring to FIG. 16, the serial/parallel conversion circuit with level conversion function includes a level conversion circuit 20 for sampling input signal IN according to clock signals /CLK and CLK and converting the voltage level of input signal IN to output the converted signal, a latch circuit 22 for latching the output signal of level conversion circuit 20 when clock signal /CLK is at H level, a shift latch circuit 24 activated when clock signal CLK is at H level for transferring and latching the latched signal of latch circuit 22, a shift latch circuit 26 activated when clock signal /CLK is at H level for shifting and latching the output signal of shift latch circuit 24 to generate output pixel signals /OTD and OTD, a level conversion circuit 30 sampling input signal IN according to clock signals CLK and /CLK and level-converting the input signal to output the level-converted signal, and a shift latch circuit 32 activated when clock signal /CLK is at H level for transferring and latching the output signal of level conversion circuit 30 to generate output pixel signals OTE and /OTE.

Level conversion circuits 20 and 30 operate complementarily to each other and each have any of the configurations of level conversion circuits described in connection with the first to eighth embodiments. Level conversion circuit 20 samples input signal IN when clock signal /CLK is at H level and level-converts the sampled input signal when clock signal CLK is at H level to output the level-converted signal. Level conversion circuit 30 samples input signal IN when clock signal CLK is at H level and level-converts the sampled input signal when clock signal /CLK is at H level to generate the level-converted signal.

Input signal IN is applied at a frequency twice as high as that of clock signals CLK and /CLK. When clock signal CLK is at H level, level conversion circuit 30 performs the sampling operation while level conversion circuit 20 performs the sampling operation when clock signal /CLK is at H level. From shift latch circuits 26 and 32, pixel signals are output in parallel when clock signal CLK is at H level. Thus, the serial/parallel conversion circuit with level conversion function shown in FIG. 16 frequency-divides the input signal IN into a signal at a frequency 0.5 times as high as the original frequency of the input signal. Accordingly, the operating frequency of the circuit in the following stage can be made lower and the operation margin can thus be enlarged.

Figure 17:
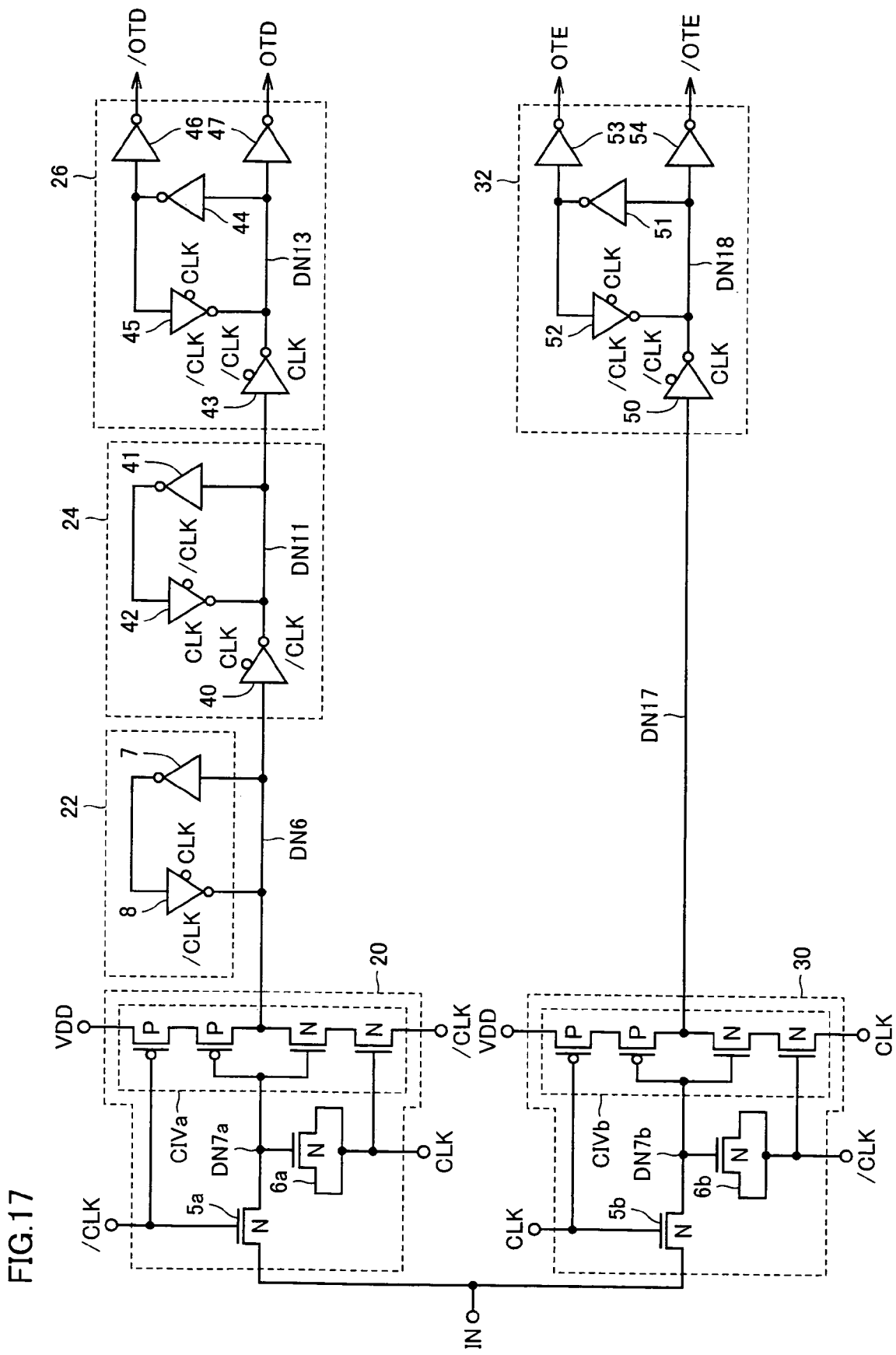
FIG. 17 specifically shows the configuration of the serial/parallel conversion circuit shown in FIG. 16.

FIG. 17 shows an exemplary configuration of the serial/parallel conversion circuit with level conversion function shown in FIG. 16. Referring to FIG. 17, level conversion circuit 20 is similar in configuration to the level conversion circuit shown in FIG. 4, and includes an N-channel MOS transistor 5a rendered conductive when clock signal /CLK is at H level to transfer input signal IN, a MOS capacitor 6a performing a charge pump operation when clock signal CLK rises to H level to supply electric charges to internal node DN7a, and a clocked inverter CIVa activated when clock signals /CLK and CLK are at L and H levels, respectively, to drive internal node DN6 according to the signal on internal node DN7a.

As in the previous embodiments, latch circuit 22 includes CMOS inverter 7 inverting a signal on internal node DN6 and clocked inverter 8 activated when clock signals CLK and /CLK are at L and H levels, respectively, to invert the output signal of inverter 7 for driving internal node DN6.

Shift latch circuit 24 includes a clocked inverter 40 activated when clock signals CLK and /CLK are at L and H levels, respectively, to invert the signal on internal node DN6 and transfer the signal to internal node DN11, an inverter 41 inverting the signal on internal node DN11, and a clocked inverter 42 activated when clock signals /CLK and CLK are at L and H levels, respectively, to invert the signal of inverter 41 and transmit the inverted signal to internal node DN11. These inverter 41 and clocked inverter 42 constitute an inverter latch when clocked inverter 42 is activated.

Shift latch circuit 26 includes a clocked inverter 43 activated when clock signals /CLK and CLK are at L and H levels, respectively, to invert the latched signal of shift latch circuit 24 and transfer the inverted signal to internal node DN13, an inverter 44 inverting the signal on internal node DN13, a clocked inverter 45 activated when clock signals CLK and /CLK are at L and H levels, respectively, to invert the signal of inverter 44 and transfer the inverted signal to internal node DN13, an inverter 46 inverting the output signal of inverter 44 to generate output signal /OTD, and an inverter 47 inverting the signal on internal node DN13 to generate output signal OTD.

Level conversion circuit 30 is similar in configuration to level conversion circuit 20, and includes an N-channel MOS transistor 5b transmitting input signal IN in response to clock signal CLK, a MOS capacitor 6b supplying electric charges to internal node DN7b in response to a rise of clock signal /CLK, and a clocked inverter CIVb activated when clock signals CLK and /CLK are at L and H levels, respectively, to drive internal node DN17 according to the signal on internal node DN7b.

Shift latch circuit 32 includes a clocked inverter 50 activated when clock signals /CLK and CLK are at L and H levels, respectively, to invert the signal on internal node DN17 and transfer the inverted signal to internal node DN18, an inverter 51 inverting the signal on internal node DN18, a clocked inverter 52 activated when clock signals CLK and /CLK are at L and H levels, respectively, to invert the output signal of inverter 51 and transmit the inverted signal onto internal node DN18, an inverter 53 inverting the output signal of inverter 51 to generate output signal OTE, and an inverter 54 inverting the signal on internal node DN18 to generate output signal /OTE.

Figure 18:
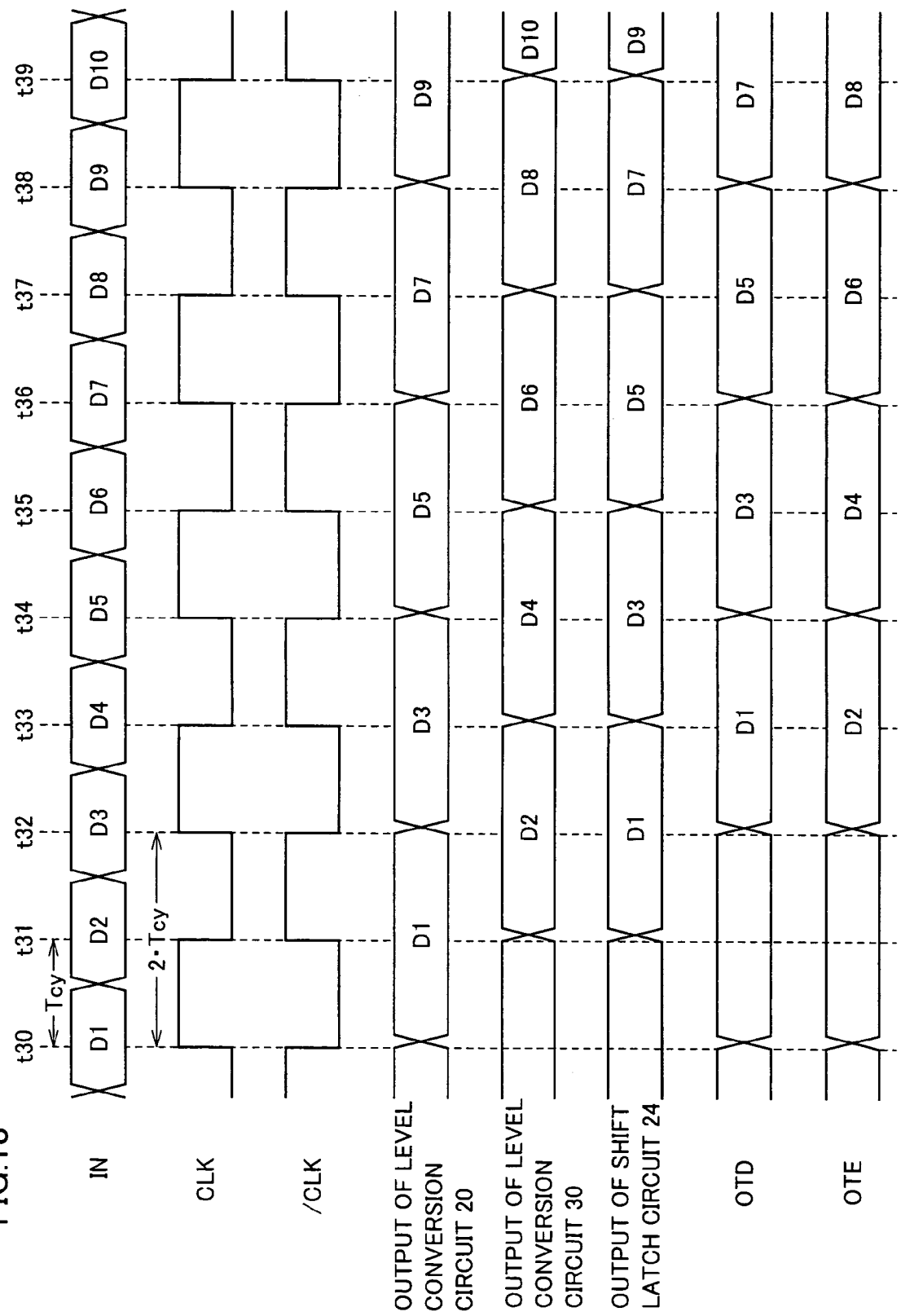
FIG. 18 is a timing diagram representing an operation of the circuit shown in FIG. 17.

In the configuration of the serial/parallel conversion circuit with level conversion function shown in FIG. 17, level conversion circuits 20 and 30 alternately perform the sampling operation and the level conversion operation according to clock signals CLK and /CLK, and shift latch circuits 26 and 32 carry out the operation of taking in the signal and the output operation in parallel. A description is now given of an operation of the serial/parallel conversion circuit with level conversion function shown in FIG. 17 with reference to the timing diagram shown in FIG. 18.

At time t30, clock signal CLK rises to H level and clock signal /CLK falls to L level. The transition timing relation between clock signals CLK and /CLK is similar to that described in connection with the first to eighth embodiments. That is, after clock signal /CLK changes, clock signal CLK changes.

In level conversion circuit 20, sampling of an input signal D1 is completed and then level conversion is carried out by clocked inverter CIVa. Since clocked inverter 8 is in an inactive state, latch circuit 22 does not perform the latching operation. At this time, in shift latch circuit 24, clocked inverter 40 is in an inactive state or in a latch state so that the output signal of level conversion circuit 20 is not taken in. Clocked inverter 43 at the initial stage of shift latch circuit 26 is activated so that the output signal of shift latch circuit 24 is taken in and outputted. In this case, however, the output signal is different from input signal D1 and is an invalid signal.

In level conversion circuit 30, input signal IN is taken in according to the rise of clock signal CLK. In this state, however, clocked inverter CIVb is in an inactive state and the signal on internal node DN17 is an invalid signal. In shift latch circuit 32, clocked inverter 50 at the initial stage is activated and output signal OTE is generated according to the signal on internal node DN17. In this case, however, the signal on internal node DN17 is a signal irrelevant to input signal D1 and is thus an invalid signal.

While the level conversion by level conversion circuit 20 and the sampling by level conversion circuit 30 are carried out in parallel, input signal IN changes to a second signal D2. At this time, as clock signal CLK is at H level, setup of input signal D2 for level conversion circuit 30 is made.

At time t31, when clock signal CLK falls to L level and clock signal /CLK rises to H level, in level conversion circuit 20, clocked inverter CIVa enters an output high impedance state. As clocked inverter 8 is activated, latch circuit 22 enters a latching state. At this time, clocked inverter 40 at the initial stage of shift latch circuit 24 is activated so that the first signal D1 on internal node DN6 is inverted to be transferred to internal node DN11. Clocked inverter 43 at the initial stage of shift latch circuit 26 is in an inactive state or latch state, so that no signal is taken in. The first data signal D1 is taken in and the output signal changes in shift latch circuit 24.

Level conversion circuit 30 takes in the second data signal D2 in response to the fall of clock signal CLK. At this time, clocked inverter CIVb is in the inactive state and thus the state of internal node DN17 does not change. In shift latch circuit 32, clocked inverter 50 is in the inactive state. Thus, shift latch circuit 32 is in a latch state and its input and output are isolated from each other so that output signals OTE and /OTE do not change.

After setup of a third input signal D3, clock signal CLK rises to H level and clock signal /CLK falls to L level at time t32. Sampling of the third input signal D3 by level conversion circuit 20 is completed. In response to the rise of clock signal CLK, a charge pump operation for internal node DN7a is carried out. At this time, clocked inverter CIVa is activated and level conversion circuit 20 outputs the level-converted signal of the third input signal D3 (when input signal D3 is at H level). In response to the rise of clock signal CLK, clocked inverter 40 at the initial stage of shift latch circuit 24 is inactivated and holds, at it output, the first data signal D1 taken in in the preceding cycle.

In shift latch circuit 32, clocked inverter 50 is activated in response to the rise of clock signal CLK and the fall of clock signal /CLK at time t32, its input and output are electrically coupled, and the shift latch circuit 32 enters a through state, and the level-converted signal corresponding to input signal D2 on internal node DN11 is output as output signal OTE.

In shift latch circuit 26, clocked inverter 43 at the initial stage is activated. Then, according to the latched signal of shift latch circuit 24 at the preceding stage, level-converted signal OTD corresponding to the first input signal D1 is generated.

It is noted that, "level-converted signal" in the following description refers to "signal outputted from clocked inverter CIVa or CIVb".

At time t33, clock signal CLK falls and clock signal /CLK rises to H level. Accordingly, clocked inverter CIVa of level conversion circuit 20 enters an output high impedance state to start sampling of input signal IN. In level conversion circuit 30, in response to the rise of clock signal /CLK, a charge pump operation is performed. When input signal D4 is at H level, internal node DN7b is boosted to a boosted-voltage level. Clocked inverter CIVb is activated so that a level-converted signal corresponding to the fourth data signal D4 is output to internal node DN17. Shift latch circuit 24 enters a through state so that a level-converted signal corresponding to the third input signal D3 is transferred. Since shift latch circuit 26 is in a latch state, output signals OTD and /OTD do not change.

At time t34, clock signal /CLK falls to L level and clock signal CLK rises to H level. Then, a sampling operation of level conversion circuit 30 is started while a level conversion operation of level conversion circuit 20 is carried out. At this time, shift latch circuit 24 is in a latch state while clocked inverter 13 at the input initial stage of shift latch circuit 26 is activated to enter a through state, so that output signal OTD corresponding to the third input signal D3 is generated. Concurrently, clocked inverter 50 of shift latch circuit 32 is activated so that a level-converted signal corresponding to the fourth input signal D4 is output as output signal OTE.

Thus, from level conversion circuit 20, odd-numbered signals in an input sequence of input signal IN is output according to a fall of clock signal /CLK at a cycle of 2·Tcy and, from level conversion circuit 30, even-numbered signals in the input sequence of input signal IN is output according to a fall of clock signal CLK.

Shift latch circuit 24 delays the output signal of level conversion circuit 20 by half a cycle Tcy of clock signals CLK and /CLK and outputs the delayed signal, and shift latch circuit 26 delays the output signal of shift latch circuit 24 by half a cycle Tcy of clock signals CLK and /CLK and outputs the delayed signal. Shift latch circuit 32 delays the output signal of level conversion circuit 30 by half a cycle Tcy of clock signals CLK and /CLK and outputs the delayed signal.

Thus, an odd-numbered signal of input signal IN is output in each cycle from level conversion circuit 20, and an even-numbered signal of input signal IN is output in each cycle from level conversion circuit 30 according to a fall of clock signal CLK. Consequently, after one clock cycle of clock signals CLK and /CLK has passed since the first input signal D1 is provided as input signal IN, even-numbered signals and odd-numbered signals of input signal IN are output in synchronization with a rise of clock signal CLK at a period of one clock cycle, or at a period twice the cycle Tcy of input signal IN. In this way, input signal IN with cycle Tcy can be level-converted to obtain output signals OTD and OTE with a cycle of 2·Tcy.

Thus, even if input signal IN is a high-speed signal, level conversion circuits 20 and 30 can be operated at a frequency 0.5 times as high as the frequency of input signal IN. The sampling and level-converting operations are reliably performed to transfer the level-converted signals to the circuitry at the subsequent stage.

Level conversion circuits 20 and 30 shown in FIG. 17 have the configuration of the level conversion circuit shown in FIG. 3. Alternatively, the configuration of level conversion circuits 20 and 30 may any of those shown in FIGS. 1, 8 and 9.

Modification

Figure 19:
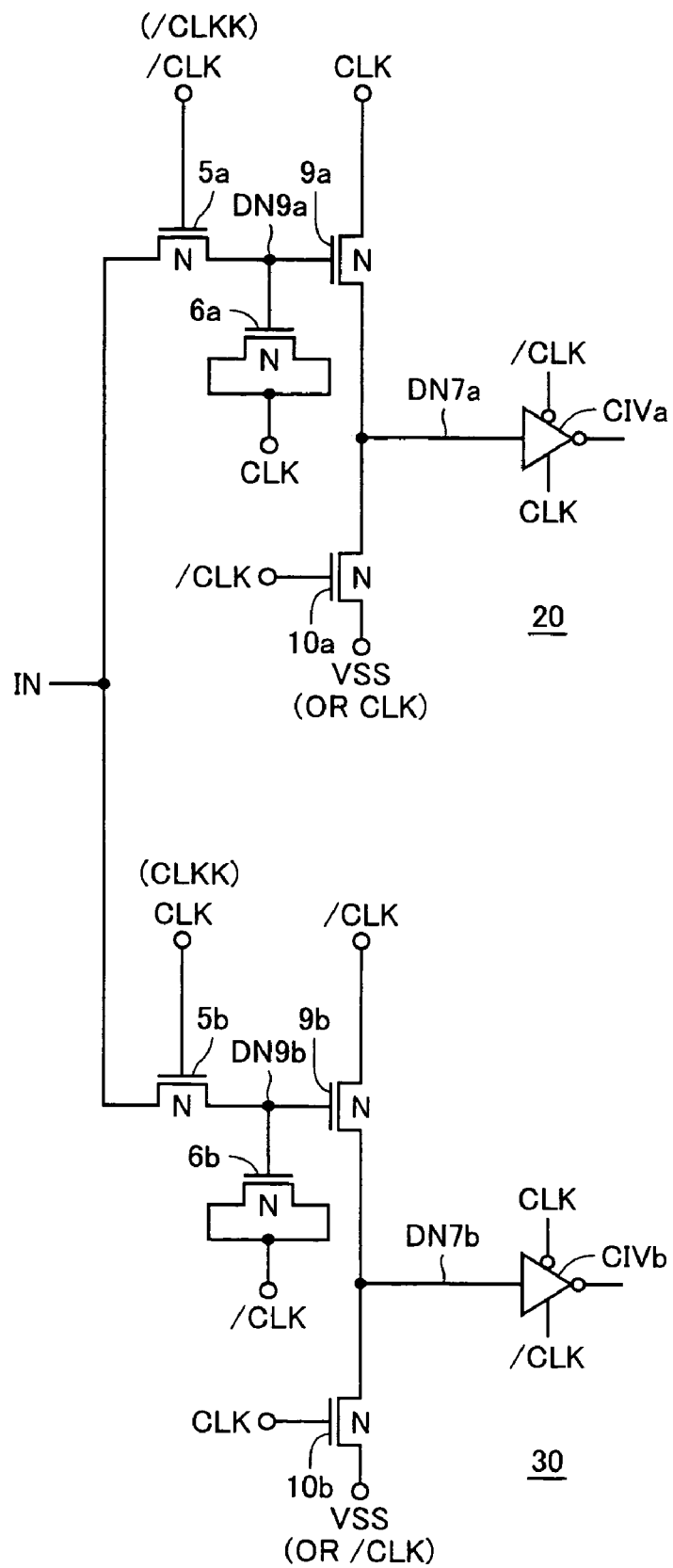
FIG. 19 shows a level conversion circuit according to a modification of the ninth embodiment of the present invention.

FIG. 19 shows a configuration of a main portion of the serial/parallel conversion circuit with level conversion function according to the ninth embodiment of the present invention. In FIG. 19, the configuration of level conversion circuits 20 and 30 of the serial/parallel conversion circuit with level conversion function is shown. Referring to FIG. 19, level conversion circuit 20 includes N-channel MOS transistor 5a transmitting input signal IN to internal node DN9a when clock signal /CLK is at H level, MOS capacitor 6a selectively performing a charge pump operation in response to a rise of clock signal CLK to supply electric charges to internal node DN9a, N-channel MOS transistor 9a transmitting clock signal CLK to internal node DN7a according to signal potential on internal node DN9a, N-channel MOS transistor 10a precharging internal node DN7a to L level according to clock signal CLK, and clocked inverter CIVa activated when clock signals CLK and /CLK are at H and L levels, respectively, to invert a signal on internal node DN7a.

Level conversion circuit 30 has its configuration similar to that of level conversion circuit 20. Specifically, level conversion circuit 30 includes N-channel MOS transistor 5b transmitting input signal IN to internal node DN9b when clock signal CLK is at H level, MOS capacitor 6b selectively performing a charge pump operation in response to a rise of clock signal /CLK to supply electric charge to internal node DN9b, N-channel MOS transistor 9b selectively transmitting clock signal /CLK to internal node DN7b according to signal potential on internal node DN9b, N-channel MOS transistor 10b turned on when clock signal CLK is at H level, to precharge internal node DN7b to L level, and clocked inverter CIVb activated when clock signals CLK and /CLK are at L and H levels, respectively, to invert a signal on internal node DN7b.

The configuration of level conversion circuits 20 and 30 shown in FIG. 19 is identical to that of the level conversion circuit shown in FIG. 11. At the following stage of level conversion circuit 20, latch circuit 22 and shift latch circuits 24, 26 shown in FIG. 16 are provided while shift latch circuit 32 shown in FIG. 16 is provided at the following stage of level conversion circuit 30.

In the configuration of the serial/parallel conversion circuit with level conversion function shown in FIG. 19, level conversion circuits 20 and 30 alternately sample and level-converts input signal IN according to clock signals CLK and /CLK. In other words, when clock signal CLK is at H level, level conversion circuit 30 takes in input signal IN while level conversion circuit 20 selectively performs a level conversion operation according to the signal taken in and latched this cycle, and clocked inverter CIVa outputs the level-converted signal.

When clock signal /CLK is at H level and clock signal CLK is at L level, level conversion circuit 20 takes in input signal IN. At this time, clocked inverter CIVa is in an inactive state. In level conversion circuit 30, MOS capacitor 6 performs a selective charge pump operation according to the sampled signal, and clock signal /CLK is selectively transmitted to clocked inverter CIVb via MOS transistor 9b.

Clocked inverter CIVb is activated and this clocked inverter CIVb generates a level-converted signal.

Thus, with the configuration shown in FIG. 19, input signal IN is taken in alternately by level conversion circuits 20 and 30 at the cycle of clock signals CLK and /CLK to perform the level conversion on the signal to generate the internal signal at a cycle twice as long as that of input signal IN.

It is noted that, as the configuration of the level conversion circuits 20 and 30 shown in FIG. 19, any of the configurations of other embodiments may be used.

As discussed above, according to the ninth embodiment of the present invention, the level conversion circuits are provided in parallel to the input node. According to complementary clock signals, the level conversion circuits are operated alternately to perform the sampling operation and the level converting operation. It is thus ensured that the cycle of input signal IN is doubled and the level conversion circuit is accordingly carried out.

If output signals OTE and OTD of the serial/parallel conversion circuit with level conversion function are display signals to be supplied to pixels, a horizontal shit register may be used to activate a horizontal driver driving a pixel data line at the same cycle as that of input signal IN so that pixel signals can be written to pixel elements according to the dot sequential system.

Tenth Embodiment

Figure 20:
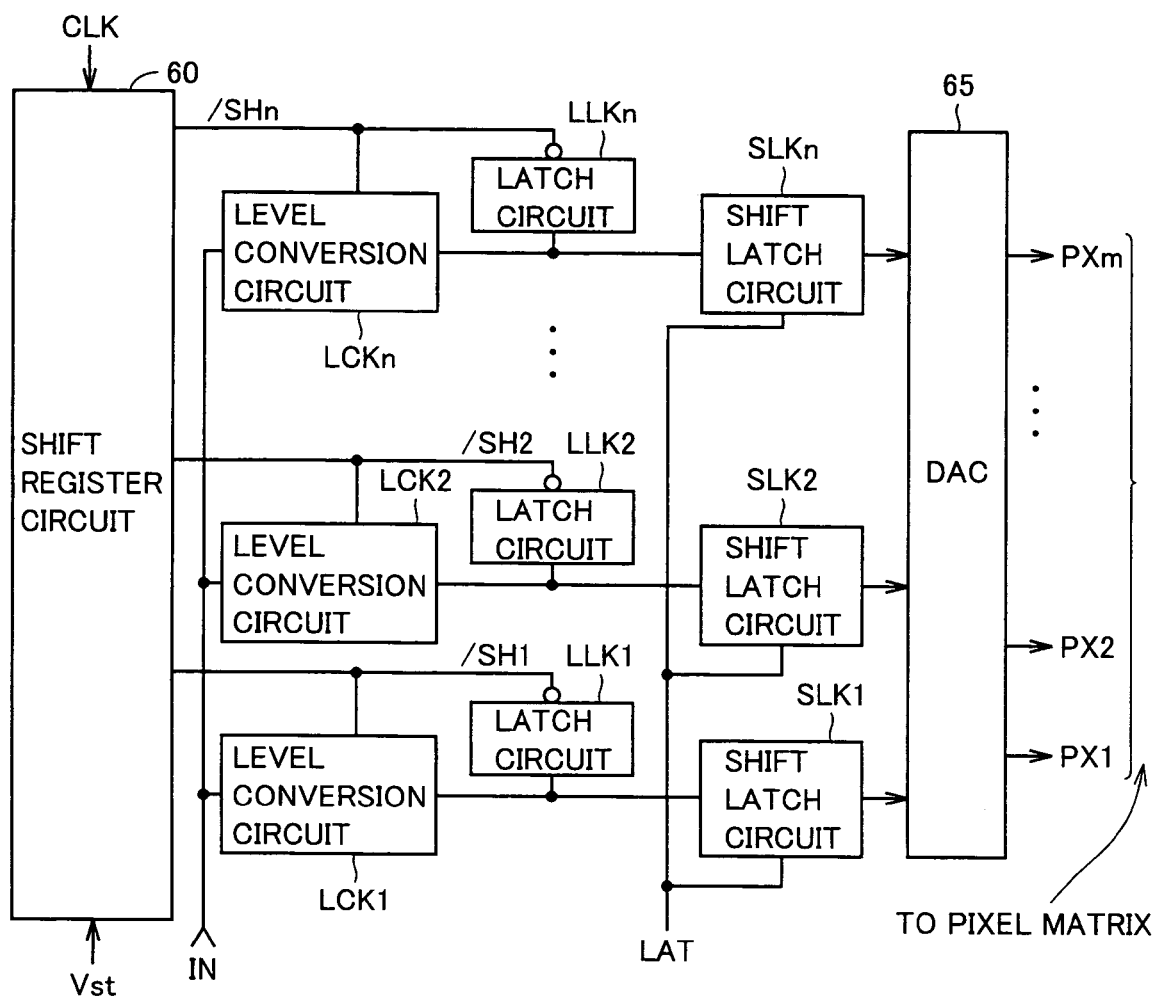
FIG. 20 schematically shows a configuration of a serial/parallel conversion circuit with level conversion function according to a tenth embodiment of the present invention.

FIG. 20 schematically shows a configuration of a serial/parallel conversion circuit with level conversion function according to a tenth embodiment of the present invention. Referring to FIG. 20, the serial/parallel conversion circuit having level conversion function includes level conversion circuits LCK1–LCKn provided in parallel to an input node for taking in and level-converting applied input signal IN according to shift clock signals /SH1–/SHn respectively from a shift register circuit 60, latch circuits LLK1–LLKn provided corresponding to level conversion circuits LCK1–LCKn and activated when corresponding shift clock signals /SH1–/SHn are at L level to latch output signals of corresponding level conversion circuits LCK1–LCKn, and shift latch circuits SLK1–SLKn provided correspondingly to level conversion circuits LCK1–LCKn, entering a through state when latch instruction signal LAT is at H level and entering a latch state when latch signal LAT is at L level.

The output signals of shift latch circuits SLK1–SLKn are supplied in parallel to a digital/analog conversion circuit (DAC) 65. Output signals PX1–PXm of digital/analog conversion circuit 65 are supplied to selected pixels of a pixel matrix (not shown). In other words, the serial/parallel conversion circuit with level conversion function shown in FIG. 20 converts serially inputted display data IN into parallel signals for a display device formed using liquid-crystal elements or organic ELs, for example. By digital/analog conversion circuit 65, analog signals are generated according to input digital data and the generated analog signals are written as pixel display signals to display elements. Digital/analog conversion circuit 65 generates, from a multi-bit digital signal, a single analog pixel display signal PXi (i=1–m) according to the gradation level of pixel display.

Shift register circuit 60 performs a shift operation following a supply start instruction signal Vst of input signal IN according to clock signal CLK and sequentially activate the shift clock signals /SH1–/SHn with a phase shift of approximately half a cycle with respect to input signal IN. Level conversion circuits LCK1–LCKn sequentially take in and level-convert input signal IN. After this, according to latch instruction signal LAT, shift latch circuits SLK1–SLKn take in and latch the respective output signals of corresponding level conversion circuits LCK1–LCKn in parallel to output the level-converted signals in parallel to digital/analog conversion circuit 65. Then, according to the level-converted signals, digital/analog conversion is performed to generate display signals PX1–PXm for pixel elements.

Figure 21:
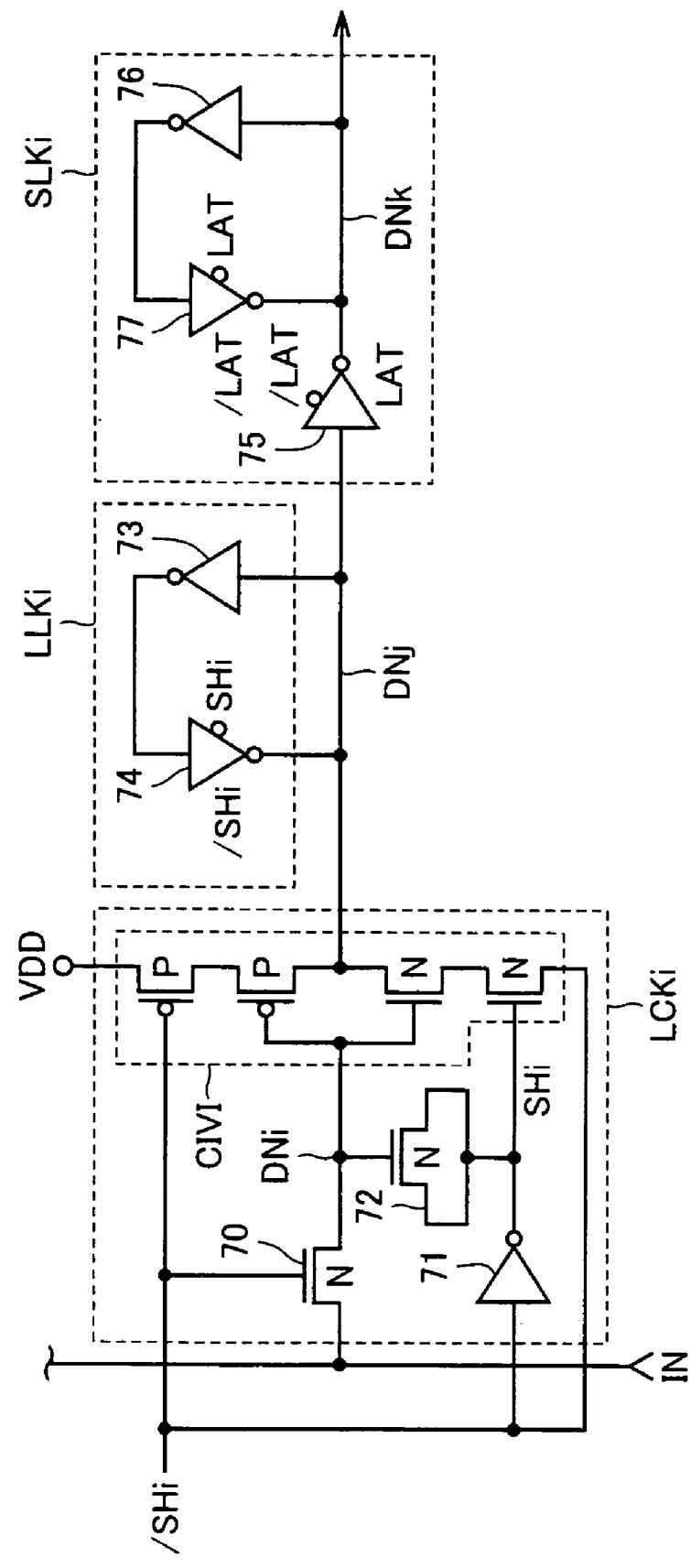
FIG. 21 specifically shows the configurations of a level conversion circuit, a latch circuit and a shift latch circuit shown in FIG. 20.

FIG. 21 shows an exemplary configuration of a section for generating a level-converted signal at a first stage of the serial/parallel conversion circuit with level conversion function shown in FIG. 20. In FIG. 21, shift clock signal /SHi from shift register circuit 60 is supplied as a sampling/level conversion timing signal.

Referring to FIG. 21, level conversion circuit LCKi includes an N-channel MOS transistor 70 transferring input signal IN to internal node DNi when shift clock signal /SHi is at H level, an inverter 71 inverting shift clock signal /SHi, a MOS capacitor 72 selectively performing a charge pump operation to supply electric charges to internal node DNi in response to a rise of output signal SHi of inverter 71, and a clocked inverter CIV1 selectively activated according to shift clock signals /SHi and SHi to generate a level-converted signal on internal node DNj according to a signal on internal node DNi.

Clocked inverter CIV1 is supplied with power supply voltage VDD at a high-side power supply node and is supplied with shift clock signal /SHi at a low-side power supply node.

Latch circuit SLKi includes an inverter 73 inverting the signal on internal node DNj, and a clocked inverter 74 selectively activated according to shift clock signals SHi and /SHi to drive internal node DNj according to the output signal of inverter 73. Clocked inverter 74 is activated complementarily to clocked inverter CIV1 when shift clock signals SHi and /SHi are at L and H levels, respectively, to invert the output signal of inverter 73.

Shift latch circuit SLKi includes a clocked inverter 75 inverting the signal on internal node DNj according to latch instruction signal LAT and complementary latch instruction signal /LAT, an inverter 76 inverting the output signal of clocked inverter 75, and a clocked inverter 77 selectively activated according to latch instruction signals LAT and /LAT to invert the output signal of inverter 76 and transmit the inverted signal to internal node DNk.

Clocked inverter 75 is activated when latch instruction signals LAT and /LAT are at H and L levels, respectively, while clocked inverter 77 is activated when latch instruction signals LAT and /LAT are at L and H levels, respectively. When inactive, clocked inverters 74, 75 and 77 enter an output high impedance state.

To the low-side power supply node of clocked inverter CIV1 in level conversion circuit LCKi, shift clock signal /CHi is supplied. Thus, no line for transmitting ground voltage VSS is necessary so that the degree of freedom in interconnection layout design is improved.

The configuration of level conversion circuit LCKi shown in FIG. 21 is substantially identical to the configuration of the level conversion circuit shown in FIG. 4. Therefore, when shift clock signal /SHi is at H level, input signal IN is taken in. When shift clock signal /SHi falls to L level, the taken input signal IN is level-converted to be outputted from clocked inverter CIV1 to internal node DNj. The signal on internal node DNj is latched by latch circuit LLKi when shift clock signals SHi and /SHi are at L and H levels, respectively.

Shift latch circuit SLki is in a latch state when latch instruction signal LAT is at L level. When latch instruction signal LAT is at H level, shift latch circuit SLKi is in a through state to invert the signal latched by corresponding latch circuit LLKi and output the inverted signal to digital/analog conversion circuit 65.

Figure 22:
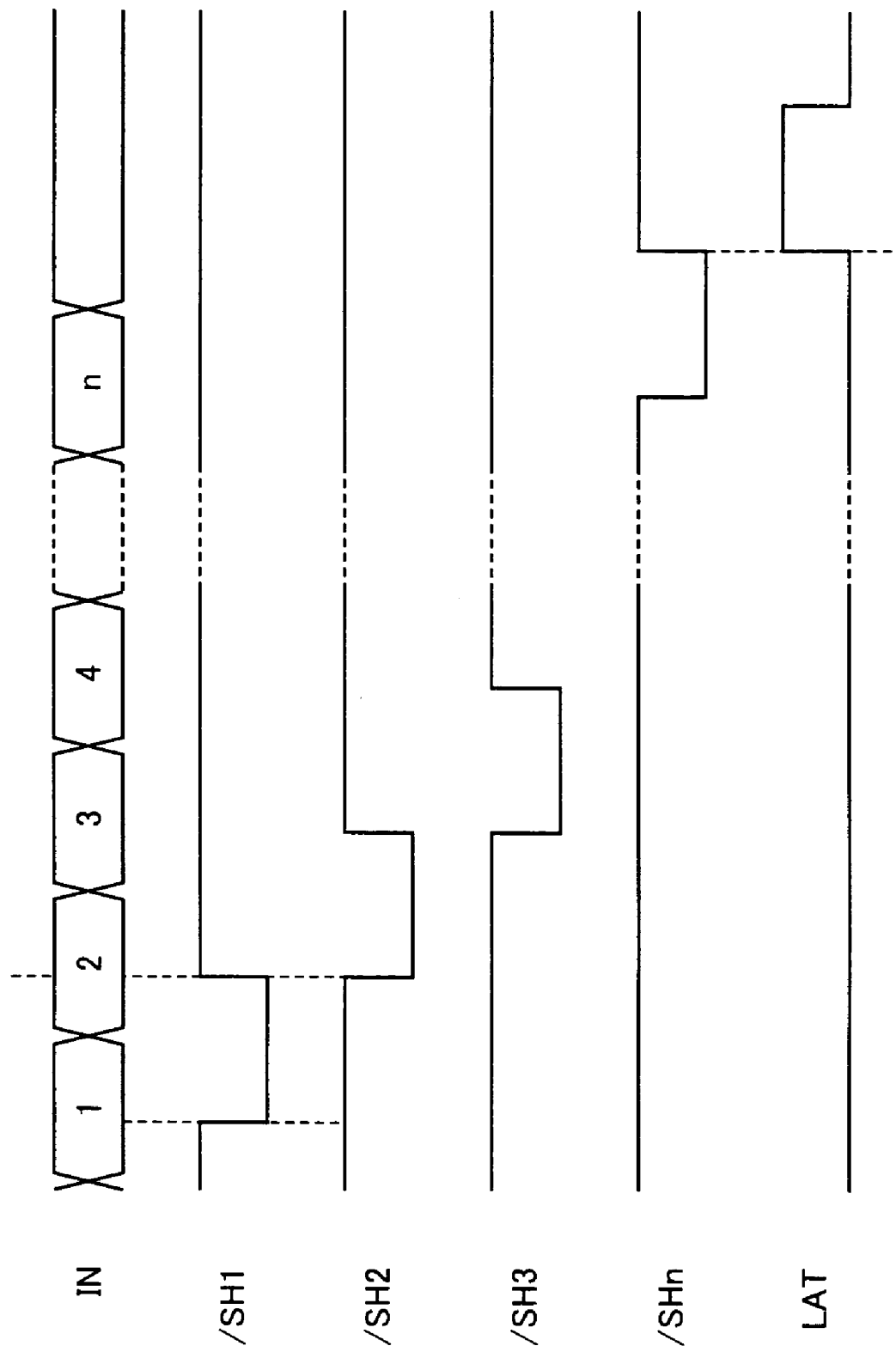
FIG. 22 is a timing diagram representing an operation of the circuitry shown in FIG. 20.

FIG. 22 is a timing diagram representing an operation of the serial/parallel conversion circuit with level conversion function shown in FIG. 20. As shown in FIG. 22, shift clock signals /SH1–/SHn are set sequentially to L level for one cycle period of input signal IN with a delay of half a clock cycle relative to input signal IN. Accordingly, input signal IN is taken in with a setup time for each of level conversion circuits LCK1–LCKn in response to a fall of a corresponding one of sampling clock signals /SH1–/SHn. In response to a fall of a corresponding one of sampling clock signals /SH1–/SHn, level conversion circuits LCK1–LCKn each selectively boost the taken-in signal to perform a level conversion operation.

After this, when corresponding sampling clock signals /SH1–/SHn rise to H level, clocked inverters CIV1 of level conversion circuits LCK1–LCKn are inactivated to enter an output high impedance state. Therefore, even if input signal IN changes, the change does not affect the level-converted signal and the level-converted signal of input signal IN is latched by corresponding latch circuits LLK1–LLKn.

When the final shift clock signal/SHn rises from L level to H level, latch instruction signal LAT subsequently rises to H level. Shift latch circuits SLK1–SLKn each enter a through state, to generate the signals according to the signals latched by latch circuits LLK1-LLKn for transmitting the generated signals to digital/analog conversion circuit 65.

After a predetermined number of input signals IN are taken and after shift clock signal /SHn rises to H level, latch instruction signal LAT is driven to H level at an appropriate timing. Therefore, this latch instruction signal LAT may be generated from the register stage subsequent to the shift register stage generating shift clock signal /SHn in shift register circuit 60, or may be generated based on a signal defining an appropriate digital/analog conversion timing.

Shift clock signals /SH1–/SHn are sufficient to be any signals each having a phase difference of the cycle of input signal IN with others, and may be signals different from output signals of shift register circuit 60.

Further, in order to generate analog signals for pixel elements of the pixel matrix, the output signals of the serial/parallel conversion circuit with level conversion function are supplied to the digital/analog conversion circuit. The output signals of the serial/parallel conversion circuit, however, may be used for other purposes. In general, the serial/parallel conversion circuit with level conversion function of the present invention can be applied to any circuit portion for performing serial/parallel conversion and having serial input signals and parallel converted signals different in voltage amplitude.

Modification

Figure 23:
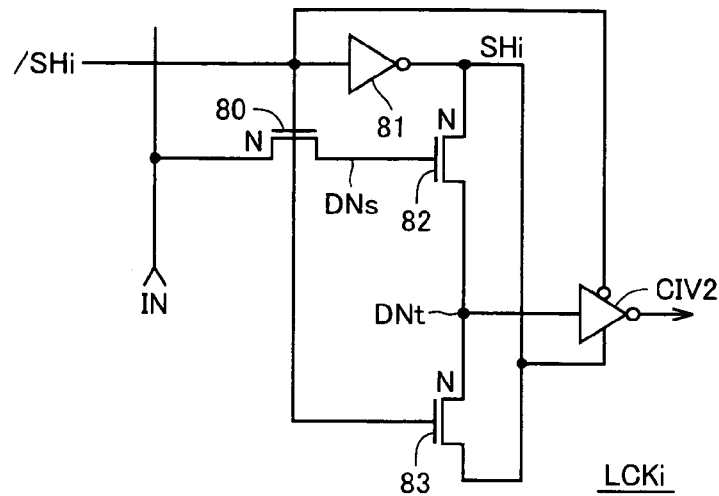
FIG. 23 shows a configuration of a level conversion circuit according to a modification of the tenth embodiment of the present invention.

FIG. 23 shows a modification of level conversion circuits LCK1–LCKn shown in FIG. 20. In FIG. 23, a configuration of level conversion circuit LCKi (i=1–n) is shown as an example since level conversion circuits LCK1–LCKn have the same configuration. Referring to FIG. 23, level conversion circuit LCKi includes an N-channel MOS transistor 80 transferring input signal IN to internal node DNs according to shift clock signal /SHi, an inverter 81 inverting shift clock signal SHi, an N-channel MOS transistor 82 selectively transferring output signal SHi of inverter 81 to internal node DNt according to signal potential on internal node DNs, an N-channel MOS transistor 83 turned on when shift clock signal /SHi is at H level for precharging internal node DNt to a ground voltage level (low level of shift clock signal SHi), and a clocked inverter CIV2 selectively activated according to shift clock signals SHi and /SHi, for inverting, when activated, a signal on internal node DNt.

Clocked inverter CIV2 is activated when shift clock signal /SHi is at L level and shift clock signal SHi is at H level, to operate as an inverter.

The configuration of level conversion circuit LCKi shown in FIG. 23 is identical to that of the level conversion circuit shown in FIG. 14. Specifically, when shift clock signal /SHi is at H level, input signal IN is taken in. When shift clock signal /SHi falls to L level, MOS transistor 80 is turned off. Output signal SHi of inverter 81 rises to H level, and accordingly, through self bootstrap function of MOS transistor 82, the voltage level of internal node DNs is increased to fully transfer H level of this signal SHi to internal node DNt (when H level signal is sampled). At this time, clocked inverter CIV2 enters an active state, the signal transferred to internal node DNt is inverted and the inverted signal is transferred to and latched by latch circuit LLKi at the following stage shown in FIG. 20.

When shift clock signal /SHi rises from L level to H level, output signal SHi of inverter 81 falls to L level, clocked inverter CIV2 is inactivated and the input and output of clocked inverter CIV2 are isolated from each other. In this state, MOS transistor 83 is in a turned-on state and internal node DNt is precharged to L level. Even if input signals IN are successively supplied to change the voltage level of internal node DNs, internal node DNt is kept at L level because output signal SHi of inverter 81 is at L level.

Thus, with level conversion circuit LCKi shown in FIG. 23, serial/parallel conversion and level conversion can be performed efficiently.

As discussed above, according to the tenth embodiment of the present invention, level conversion circuits are provided in parallel to carry out the sampling and the level conversion sequentially in a shifted manner. Accordingly, serial input signals can efficiently be converted into parallel signals and the voltage amplitude of the serial input signals can be converted.

Eleventh Embodiment

Figure 24:
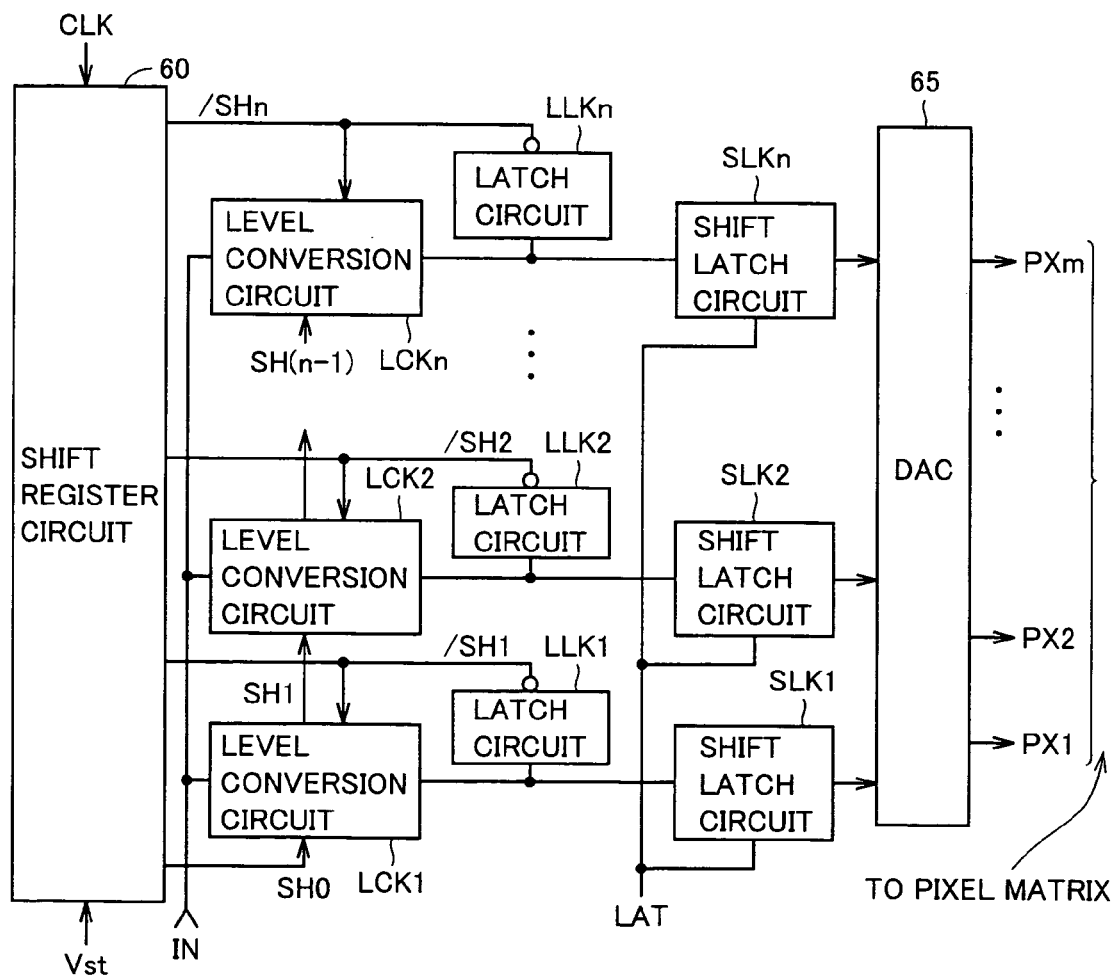
FIG. 24 schematically shows a configuration of a serial/parallel conversion circuit with level conversion function according to an eleventh embodiment of the present invention.

FIG. 24 schematically shows a configuration of a serial/parallel conversion circuit with level conversion function according to an eleventh embodiment of the present invention. The serial/parallel conversion circuit with level conversion function shown in FIG. 24 differs in configuration from that shown in FIG. 20 in that, by level conversion circuits LCK1–LCKn for level-converting input signal IN, the input signal is sampled according to shift clock signals SH0–SH (n−1) from level conversion circuits at the preceding stages and is level-converted according to a corresponding one of shift clock signals /SH1–/SHn. Other specific configuration of serial/parallel conversion circuit with level conversion function shown in FIG. 24 is identical to the configuration shown in FIG. 20. Then, like components are denoted by like reference characters and the description thereof is not repeated.

Level conversion circuits LCK1–LCKn shown in FIG. 24 each take in input signal IN when a level conversion circuit at the preceding stage is performing a level conversion operation. After input signal IN is taken in, the shift clock signal at the preceding stage is kept in an inactive state of H level. Accordingly, in level conversion circuits LCK1–LCKn, the MOS transistor at the input stage (MOS transistor 70 in FIG. 21 or MOS transistor 80 in FIG. 23) turns conductive. Thus, input signal IN is merely required to drive the internal node of a selected level conversion circuit and the capacitance element connected thereto (where a MOS capacitor is provided), so that the load of the input signal can be reduced and accordingly power consumption can be reduced.

Figure 25:
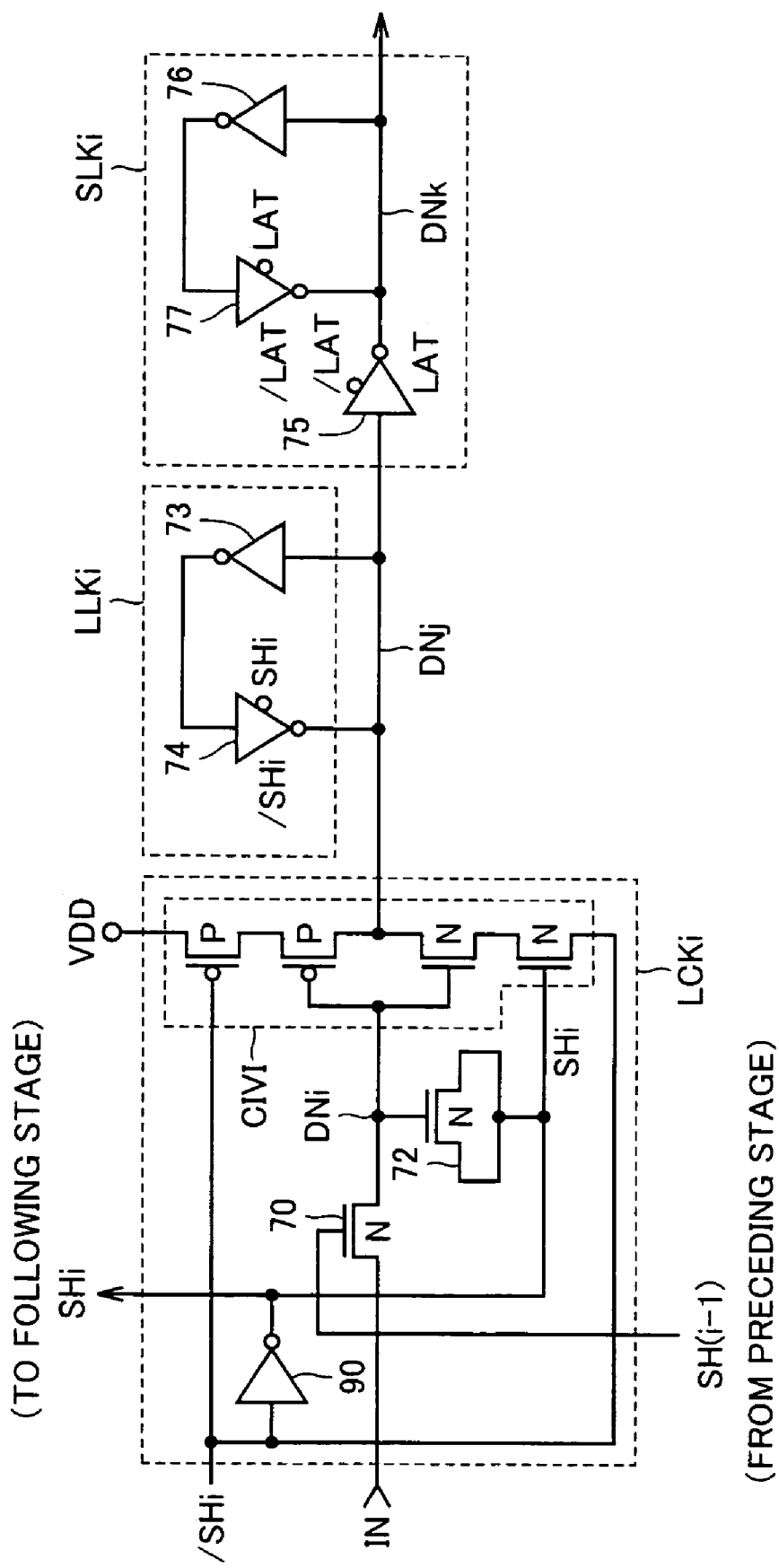
FIG. 25 specifically shows respective configurations of a level conversion circuit, a latch circuit and a shift latch circuit shown in FIG. 24.

FIG. 25 shows an exemplary configuration of level conversion circuits LCK1–LCKn shown in FIG. 24. In FIG. 25, the configuration of level conversion circuit LCKi is shown as an example. The level conversion circuit LCKi shown in FIG. 25 differs in configuration from level conversion circuit LCKi shown in FIG. 21 in that an output signal of inverter 90 receiving a corresponding shift clock signal /SHi is provided to an electrode node (source and drain nodes) of MOS capacitor 72, and also to the gate of N-channel MOS transistor 4 for controlling activation of clocked inverter CIV1. Further, the output signal of inverter 90 is applied as a sampling timing signal of level conversion circuit LCK (i+1) at the following stage. To the gate of N-channel MOS transistor 70 at the input stage, shift timing signal SH (i−1) for level conversion circuit LCK (i−1) at the preceding stage is supplied. Other specific configuration of level conversion circuit LCKi shown in FIG. 25 are identical to the configuration shown in FIG. 21. Then, like components are denoted by like reference numerals and the description thereof is not repeated.

In addition, the configuration of latch circuit LLKi and shift latch circuit SLKi is identical to that shown in FIG. 24 and like components are denoted by like reference numerals and the description thereof is not repeated.

The operation timing of level conversion circuit LCKi shown in FIG. 25 is identical to that shown in FIG. 22. Specifically, shift register circuit 60 operates similarly to shift register circuit 60 shown in FIG. 20 except that it generates sampling timing signal SH0 for level conversion circuit LCK1 at the initial stage.

Figure 26:
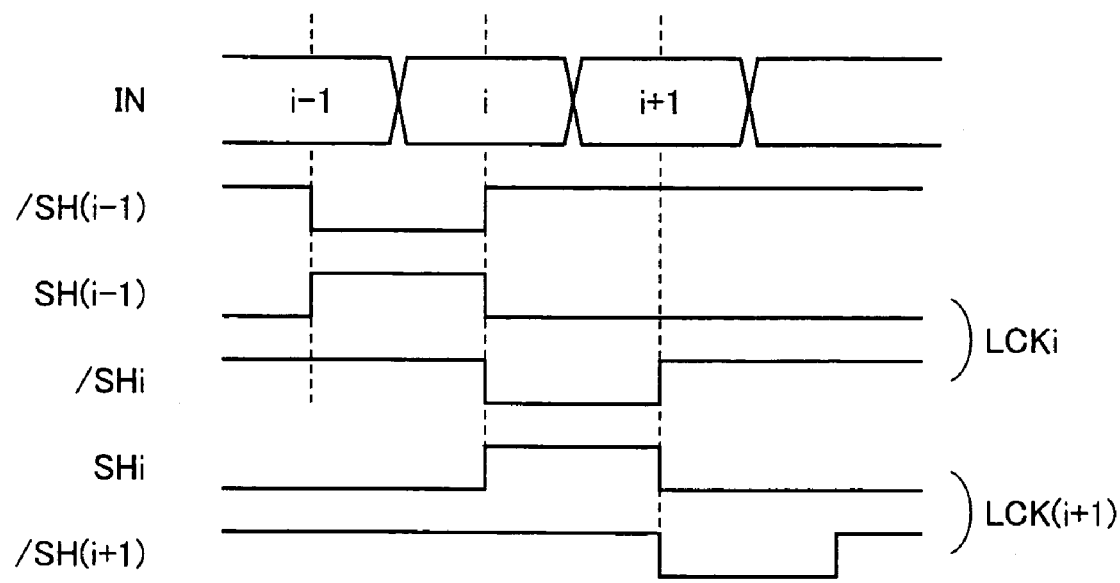
FIG. 26 is a timing diagram representing an operation of the circuitry shown in FIG. 25.

FIG. 26 is a timing diagram representing an operation of level conversion circuit LCKi shown in FIG. 25. Referring to FIG. 26, the operation of level conversion circuit LCKi shown in FIG. 25 is described.

When shift clock signal /SH (i−1) from shift register circuit 60 falls from H level to L level, inverted shift clock signal (sampling timing signal) SH (i−1) rises from L level to H level. Accordingly, MOS transistor 70 shown in FIG. 25 is turned on and input signal IN is transmitted to internal node DNi. At this time, in level conversion circuit LCK (i−1), a level-converting operation is being performed according to shift clock signal /SH (i−1). In the period in which inverted shift clock signal SH (i−1) is at H level, input signal IN changes to an i-th input signal. Then, when shift clock signal /SH (i−1) rises to H level, inverted shift clock signal SH (i−1) falls to L level so that MOS transistor 70 shown in FIG. 25 is turned off. At this time, shift clock signal /SHi is at L level, clocked inverter CIV1 is activated and a selective level conversion operation is performed on the sampled signal. When the level conversion is performed in level conversion circuit LCKi, inverted shift clock signal SHi output from inverter 90 is at H level. In level conversion circuit LCK (i+1) at the following stage, this inverted shift clock signal SHi is used as a sampling timing signal. Then, MOS transistor 70 at the input stage is turned on to take in input signal IN. When shift clock signal /SHi rises to H level, clocked inverter CIV1 of level conversion circuit LCKi is inactivated and the level-converted signal is latched by latch circuit LLKi at the subsequent stage.

Level conversion circuit LCK (i+1) at the subsequent stage completes its sampling operation and then carries out the level conversion and the latch operation according to shift clock signal /SH (i+1).

In this way, in level conversion circuits LCK1–LCKn, the MOS transistor (transistor 70) at the input stage is turned on when input signal IN is to be taken in. After the sampling operation is completed, MOS transistor 70 at the input stage is held in a turned-off state. Thus, input signal IN is merely coupled to internal node DNi of the selected level conversion circuit all the time so that the load of the input signal can be reduced.

First Modification

Figure 27:
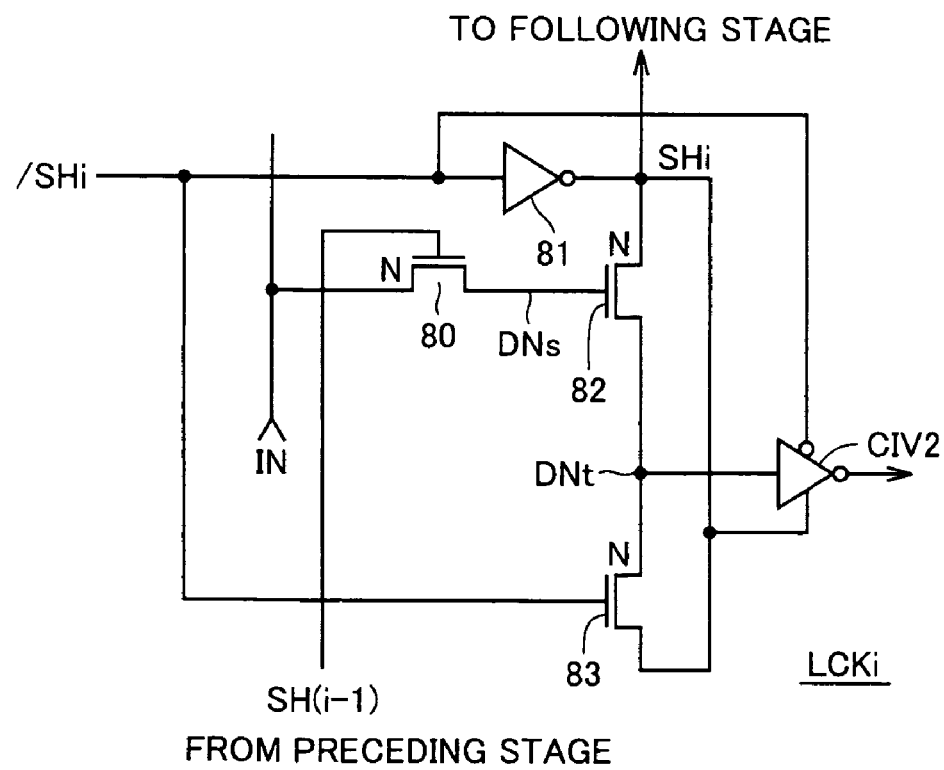
FIG. 27 shows a configuration of a level conversion circuit according to a modification of the eleventh embodiment of the present invention.

FIG. 27 shows a modification of the level conversion circuit in the eleventh embodiment of the present invention. Level conversion circuit LCKi shown in FIG. 27 differs in configuration from the level conversion circuit shown in FIG. 23 in the following points. Specifically, to the gate of MOS transistor 80 at the input stage, inverted shift clock signal SH (i−1) to the level conversion circuit (LCK (i−1)) at the preceding stage is supplied as a sampling timing signal. Further, inverted shift clock signal SHi from inverter 81 is supplied, as a sampling timing signal, to the gate of the MOS transistor at the input stage of the level conversion circuit (LCK (i+1)) at the subsequent stage. Other specific configuration of the level conversion circuit shown in FIG. 27 is identical to the configuration of level conversion circuit LCKi shown in FIG. 23, and like components are denoted by like reference numerals and the description thereof is not repeated.

In the configuration of level conversion circuit LCKi shown in FIG. 27 as well, inverted shift clock signal SH (i−1) rises to H level when level conversion circuit LCKi is selected so that MOS transistor 80 is turned on and input signal IN is transmitted to internal node DNs. When inverted shift clock signal SH (i−1) falls to L level, MOS transistor 80 is turned off. Accordingly, shift clock signal /SHi falls to L level, inverted shift clock signal SHi from inverter 81 rises to H level, and internal node DNt is driven according to the signal transferred to input node DNs. Clocked inverter CIV2 is activated to generate a level-converted signal and this signal is latched by a latch circuit (LLKi) (not shown).

When shift clock signal /SHi rises to H level, inverted shift clock signal SHi falls to L level and internal node DNt is maintained at a ground voltage level again. Thus, internal node DNt is prevented from entering a floating state.

Where level conversion circuit LCi shown in FIG. 27 is employed, input signal IN is coupled to the internal node of a selected level conversion circuit only, and thus, the load of input signal IN is reduced.

Second Modification

Figure 28:
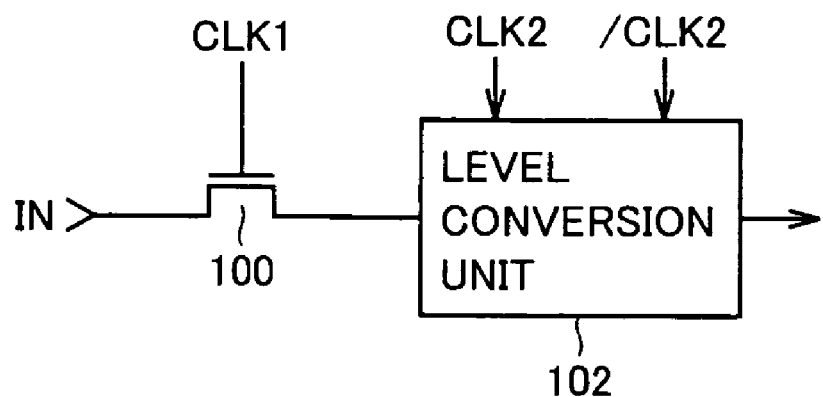
FIG. 28 schematically shows a level conversion circuit according to another modification of the eleventh embodiment of the present invention.

FIG. 28 shows another modification of the level conversion circuit in the eleventh embodiment of the present invention. To the level conversion circuit shown in FIG. 28, input signal IN is applied sporadically and the level conversion circuit level-converts this single-shot input signal IN. Specifically, the level conversion circuit shown in FIG. 28 includes a MOS transistor 100 transferring input signal IN according to clock signal CLK1 and a level conversion unit 102 level-converting and latching the signal transferred via MOS transistor 100 according to clock signals CLK2 and /CLK2. Level conversion unit 102 has the circuit configuration of any of the level conversion circuits of the first to the ninth embodiments except for the MOS transistor at the input stage. When clock signal CLK2 is at H level and clock signal /CLK2 is at L level, level conversion unit 102 is activated to convert an H level of the sampled signal into an H level at a voltage level higher than the H level of the sampled signal.

Figure 29:
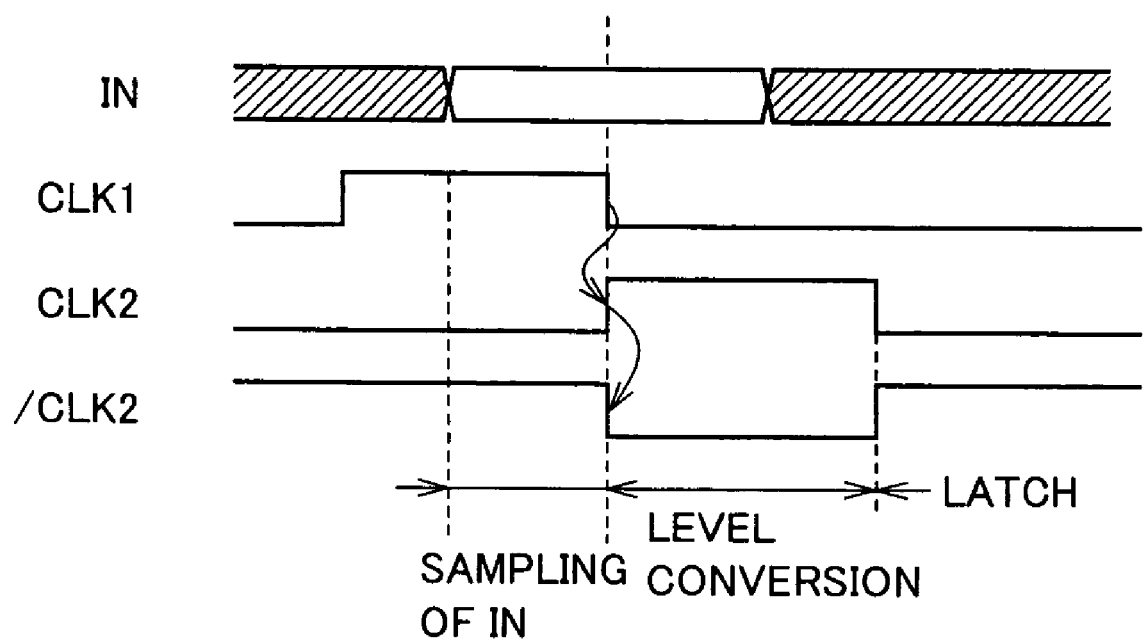
FIG. 29 is a timing diagram representing an operation of the circuit shown in FIG. 28.

FIG. 29 is a signal waveform diagram representing an operation of the level conversion circuit shown in FIG. 28.

Referring to FIG. 29, the operation of the level conversion circuit shown in FIG. 28 is briefly described.

When clock signal CLK1 rises to H level, MOS transistor 100 is turned on and input signal IN is transferred to level conversion unit 102. At this time, clock signals CLK2 and /CLK2 are at L level and H level, respectively, so that level conversion unit 102 remains in an inactive state.

When clock signal CLK1 falls to L level, MOS transistor 100 is disabled and the sampling period of input signal IN completes.

After the sampling of input signal IN is completed, subsequently clock signal CLK2 rises to H level and clock signal /CLK2 falls to L level. Accordingly, level conversion unit 102 is activated to level-convert the sampled input signal IN and generate an internal signal. When clock signal CLK2 falls to L level and clock signal /CLK2 rises to H level, level conversion unit 102 is inactivated again to enter an output high impedance state. At this time, clock signal CLK1 is at L level and the level conversion for input signal IN supplied in the "single-shot" manner is completed.

Thus, by setting the respective voltage levels of clock signals CLK1, CLK2 and /CLK2 in accordance with the timing at which input signal IN is applied, input signal IN can be reliably taken in and level-converted. In particular, generating clock signal CLK1 and clock signals CLK2 and /CLK2 through separate paths ensures such sequence that the input signal is sampled and then level-converted by level conversion unit 102.

As discussed above, according to the eleventh embodiment of the present invention, when the serial/parallel conversion and the level conversion are carried out, the input signal is transmitted to only the selected level conversion circuit and the input signal is taken in and then level-converted according to a corresponding clock signal (shift clock signal). The internal node of only the selected level conversion circuit is coupled to input signal IN, so that the load of input signal IN is reduced.

Moreover, when input signal IN applied in the "single-shot" manner is to be level-converted, individual clock signals can be formed through separate paths to increase the timing margin.

The configuration of level conversion circuits LCKi shown in FIGS. 25 and 27 may be any of the configurations of other embodiments.

Further, the configuration of the clocked inverter may be the one as shown in FIG. 9 in which the MOS transistors coupled to the internal node are coupled to the high-side and low-side power supplies and the MOS transistors having their gates receiving the clock signals are coupled to the output node of the clocked inverter.

The present invention is generally applicable to a level conversion circuit converting the voltage amplitude of an input signal, particularly applicable effectively to display devices using liquid-crystal or organic EL elements requiring the above-described level conversion.

In addition, the level conversion circuit according to the present invention is applicable to an interface between power supplies at respective voltage levels different from each other in a configuration employing a plurality of power supplies as in a system LSI.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level conversion circuit comprising:
   a first insulated gate field effect transistor of a first conductivity type for transferring an input signal applied to an input node to a first internal node according to a first clock signal from a first clock input node;
   a MOS type capacitance element formed of an insulated gate type field effect transistor and connected between a second clock input node receiving a second clock signal and said first internal node for selectively forming a capacitance according to a potential difference between said first internal node and said second clock input node; and
   a clocked inverter activated, when said first insulated gate field effect transistor is non-conductive, according to one of said first clock signal and a clock signal corresponding to the first clock signal and said second clock signal, and inverting, when activated, a potential on said first internal node to generate, on a second internal node, a signal having an amplitude larger than an amplitude of said input signal.

2. The level conversion circuit according to claim 1, wherein
   to a low-side power supply node of said clocked inverter, the clock signal the same in amplitude as said second clock signal among the first clock signal from said first clock input node and the clock signal corresponding to the first clock signal is applied, and
   to a high-side power supply node of said clocked inverter, a voltage corresponding to a logical high level of the second clock signal from said second clock input node is applied, and
   the clock signals on said first clock input node and said second clock input node are different in phase from each other.

3. The level conversion circuit according to claim 1, wherein
   said clocked inverter includes:
   a second insulated gate field effect transistor of a second conductivity type coupled to a high-side power supply node and having a gate connected to said first internal node;
   a third insulated gate field effect transistor of the second conductivity type connected between said second insulated gate field effect transistor and said second internal node and having a gate receiving one of the first clock signal from said first clock input node and the clock signal in phase with said first clock signal;
   a fourth insulated gate field effect transistor of the first conductivity type connected to a low-side power supply node and having a gate connected to said first internal node; and
   a fifth insulated gate field effect transistor of the first conductivity type connected between said fourth insulated gate field effect transistor and said second internal node and having a gate receiving the second clock signal from said second clock input node.

4. The level conversion circuit according to claim 1, wherein
   the first clock signal applied to said first clock input node is greater in amplitude than the second clock signal from said second clock input node.

5. The level conversion circuit according to claim 1, wherein
   said first clock signal changes with a delay to said second clock signal.

6. A level conversion circuit comprising:
a first insulated gate field effect transistor of a first conductivity type for transferring an input signal to a first internal node according to a first clock signal from a first clock input node;
a second insulated gate field effect transistor of the first conductivity type for transmitting a second clock signal applied to a second clock input node to a second internal node according to a potential on said first internal node;
a low drive circuit for driving said second internal node to a voltage level of a low-side power supply node according to a clock signal in phase with the first clock signal on said first clock input node; and
a clocked inverter, when activated according to clock signals in phase with the clock signals on said first clock input node and said second clock input node, for driving a third internal node in accordance with a signal potential on said second internal node.

7. The level conversion circuit according to claim 6, further comprising a MOS capacitance element formed of an insulated gate type field effect transistor and coupled to said first internal node for selectively forming a capacitance according to a potential difference between the second clock signal on said second clock input node and said first internal node.

8. The level conversion circuit according to claim 6, further comprising a MOS capacitance element formed of an insulated gate type field effect transistor and connected between said first internal node and said second internal node and forming a capacitance when a voltage on said first internal node is higher than a voltage on said second internal node.

9. The level conversion circuit according to claim 6, wherein
said low drive circuit includes a third insulated gate field effect transistor of the first conductivity type connected between said low-side power supply node and said second internal node and having a gate receiving a clock signal corresponding to the first clock signal on said first clock input node.

10. The level conversion circuit according to claim 6, wherein
said low drive circuit includes:
a third insulated gate field effect transistor of the first conductivity type connected between said second internal node and said low-side power supply node and having a gate connected to a fourth internal node;
a fourth insulated gate field effect transistor of the first conductivity type connected between said fourth internal node and said low-side power supply node and having a gate connected to said second internal node; and
a fifth insulated gate field effect transistor of a second conductivity type connected between said fourth insulated gate field effect transistor and a high-side power supply node and having a gate receiving a clock signal in phase with the second clock signal on said second clock input node.

11. A level conversion circuit comprising:
a clocked inverter enabled in response to a first clock signal and inverting and transferring, when enabled, a signal on a first node onto a second node;
a first insulated gate field effect transistor made conductive when said clocked inverter is inactive, and transferring, when made conductive, an input signal onto the first node; and
a MOS capacitance element formed of an insulated gate field effect transistor and connected between said first node and a third node, for selectively performing a charge pump operation in response to the first clock signal when said clocked inverter is enabled.

12. The level conversion circuit according to claim 11, wherein
the first clock signal comprises complementary signals, and
one of the complementary signal is applied to said first insulated gate field effect transistor and the other of the complementary signals is applied to the third node such that the first insulated gate field transistor is made conductive when said clocked inverter is inactive.

13. The level conversion circuit according to claim 11, wherein
the first insulated gate field effect transistor is made conductive in response to a second clock signal different in phase from the first clock signal.

14. A level conversion circuit comprising:
a first insulated gate field effect transistor made conductive in response to a first clock signal and transferring, when conductive, an input signal onto a first node;
a second insulated gate field effect transistor selectively made conductive according to a signal on said first node and transferring, when made conductive, a second clock signal onto a second node;
a third insulated gate field effect transistor selectively made conductive according to a third clock signal complementary to said second clock signal and transferring, when made conductive, the second clock signal onto said second node; and
a clocked inverter made active in response to the second and third clock signals when said third insulated gate field effect transistor is non-conductive, and inverting and transferring the signal on the second node onto a subsequent node.

15. A serial/parallel conversion circuit with level conversion function comprising:
a first level conversion circuit including: a first insulated gate field effect transistor of a first conductivity type for transferring an input signal applied to an input node to an internal node according to a clock signal from a first clock input node receiving the clock signal corresponding to a first clock signal; a MOS capacitance element connected between a second clock input node receiving a second clock signal and said internal node for selectively forming a capacitance according to a potential difference between said internal node and said second clock input node; and a clocked inverter selectively activated, when said first insulated gate field effect transistor is in a turned-off state, according to said first clock signal and said second clock signal, for inverting a potential on said first internal node to generate, on a second internal node, a signal having an amplitude larger than an amplitude of said input signal;
a second level conversion circuit having a same configuration as said first level conversion circuit and operating complementarily to said first level conversion circuit according to the clock signal corresponding to said first clock signal and said second clock signal for level-converting said input signal; and
a transfer circuit taking in output signals of said first level conversion circuit and said second level conversion circuit according to the first and second clock signals for outputting taken-in output signals in parallel, the first and second clock signals each having a cycle twice as long as a cycle at which said input signal is applied.

16. A serial/parallel conversion circuit with level conversion function comprising:
   a first level conversion circuit including: an insulated gate field effect transistor of a first conductivity type for transferring an input signal to a first internal node according to a clock signal from a first clock input node; a second insulated gate field effect transistor of the first conductivity type for transmitting a second clock signal applied to a second clock input node to a second internal node according to a voltage on said first internal node; a low drive circuit driving said second internal node to a voltage level on a low-side power supply node according to a first clock signal in phase with the clock signal on said first clock input node; and a clocked inverter enabled according to clock signals corresponding to the clock signals on said first clock input node and second clock input node, for driving a third internal node according to the signal on said second internal node;
   a second level conversion circuit having a same configuration as said first level conversion circuit and operating complementarily to said first level conversion circuit according to the clock signal corresponding to the clock signal on said first clock input node and said second clock signal, for level-converting said input signal to generate an output signal in parallel with said first level conversion circuit; and
   a transfer circuit taking in output signals of the first and second level conversion circuits for outputting the taken-in signals in parallel according to the first and second clock signals,
   said first and second clock signals each having a cycle twice as long as a cycle at which said input signal is applied.

17. A serial/parallel conversion circuit with level conversion function comprising:
   a plurality of level conversion circuits provided in parallel with each other, each level conversion circuit including: a first insulated gate field effect transistor of a first conductivity type for transferring an input signal applied to an input node to an internal node according to a first logic level of a first clock signal from a first clock input node; a MOS capacitance element connected between said internal node and a second clock input node receiving a clock signal complementary to the first clock signal for selectively forming a capacitance according to a potential difference between said internal node and said second clock input node; and a clocked inverter selectively activated, when said first insulated gate field effect transistor is non-conductive, in accordance with the first and second clock signals, for inverting, when activated, a potential on said internal node to generate, on a second internal node, a signal having an amplitude larger than an amplitude of said input signal;
   a plurality of output latch circuits provided corresponding to the respective level conversion circuits, for latching output signals of corresponding level conversion circuits according to a latch instruction signal; and
   a clock supply circuit for supplying clock signals to respective first clock input nodes of said plurality of level conversion circuits such that the clock signals on the respective first clock input nodes differ in period of said first logic level from each other.

18. A serial/parallel conversion circuit with level conversion function comprising:
   a plurality of level conversion circuits provided commonly to an input signal, each level conversion circuit including: an insulated gate field effect transistor of a first conductivity type for transferring said input signal to a first internal node according to a first logic level of a clock signal from a first clock input node; a second insulated gate field effect transistor of the first conductivity type for transmitting, to a second internal node, a second clock signal applied to a second clock input node according to a voltage on said first internal node; a low drive circuit for driving said second internal node to a voltage level of a low-side power supply node according to a clock signal in phase with the clock signal on said first clock input node; and a clocked inverter selectively enabled according clock signals corresponding to the clock signals on said first clock input node and said second clock input node, for driving a third internal node according to a signal on said second internal node;
   a plurality of latch circuits provided corresponding to the respective level conversion circuits, for latching output signals of corresponding level conversion circuits according to a latch instruction signal; and
   a clock supply circuit for supplying the clock signals to the respective first clock input nodes of said plurality of level conversion circuits such that the clock signals at the first and second clock nodes of the respective level conversion circuits are different in period of said first logic level from each other.

19. A serial/parallel conversion circuit with level conversion function comprising:
   a plurality of level conversion circuits coupled commonly to an input node, each level conversion circuit including: a first insulated gate field effect transistor of a first conductivity type for transferring an input signal applied to said input node to a first internal node according to a clock signal from a first clock input node; a MOS capacitance element connected between a second clock input node and said first internal node for selectively forming a capacitance according to a potential difference between said first internal node and said second clock input node; and a clocked inverter selectively activated, when said first insulated gate field effect transistor is non-conductive, according to a clock signal from said second clock input node and a clock signal complementary to the clock signal on said second clock input node, for inverting a potential on said first internal node to generate, on a second internal node, a signal that has an amplitude larger than an amplitude of said input signal;
   a plurality of output latch circuits provided corresponding to the respective level conversion circuits, for latching output signals of corresponding level conversion circuits according to a common latch instruction signal; and
   a clock supply circuit for supplying clock signals to the respective second clock input nodes of said plurality of level conversion circuits such that said plurality of clocked inverters are activated in different periods of time from each other, the clock signal applied to the second clock input node of the level conversion circuit at a preceding stage in a clock supply sequence being inverted to be supplied to the first clock input node of the level conversion circuit at a subsequent stage in the clock supply sequence.

20. A serial/parallel conversion circuit with level conversion function comprising:

a plurality of level conversoin circuits provided commonly to an input signal, each level conversion circuit including: an insulated gate field effect transistor of a first conductivity type for transferring said input signal to a first internal node according to a clock signal from a first clock input node; a second insulated gate field effect transistor of the first conductivity type for transmitting a second clock signal applied to a second clock input node to a second internal node according to a voltage on said first internal node; a low-side drive circuit for driving said second internal node to a voltage level of a low-side power supply node according to a third clock signal opposite in phase to said second clock signal; and a clocked inverter selectively activated according to the second and third clock signals and driving, when activated, a third internal node according to a signal on said second internal node;

a plurality of output latch circuits provided corresponding to the respective level conversion circuits, for latching output signals of corresponding level conversion circuits according to a common latch instruction signal; and a clock supply circuit for supplying clock signals to the respective second clock input nodes of said plurality of level conversion circuits such that the clocked inverters are activated in different periods of time from each other, the clock signal applied to the second clock input node of the level conversoin circuit at a preceding stage in a clock supply sequence being inverted to be supplied to the first clock input node of the level conversion circuit at a subsequent stage in said clock supply sequence.

* * * * *